(12) United States Patent
Wang et al.

(10) Patent No.: US 12,396,240 B2
(45) Date of Patent: Aug. 19, 2025

(54) SOURCE/DRAIN SILICIDE FOR MULTIGATE DEVICE PERFORMANCE AND METHOD OF FABRICATING THEREOF

(71) Applicant: Taiwan Semiconductor Manufacturing Company, Ltd., Hsin-Chu (TW)

(72) Inventors: Chih-Ching Wang, Kinmen County (TW); Chung-I Yang, Hsinchu (TW); Jon-Hsu Ho, New Taipei (TW); Wen-Hsing Hsieh, Hsinchu (TW); Chung-Wei Wu, Hsin-Chu County (TW); Zhiqiang Wu, Hsinchu County (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 18/447,183

(22) Filed: Aug. 9, 2023

(65) Prior Publication Data
US 2023/0387240 A1 Nov. 30, 2023

Related U.S. Application Data

(62) Division of application No. 17/231,925, filed on Apr. 15, 2021, now Pat. No. 12,218,214.

(51) Int. Cl.
*H10D 64/62* (2025.01)
*H01L 21/02* (2006.01)
(Continued)

(52) U.S. Cl.
CPC ......... *H10D 64/62* (2025.01); *H01L 21/0259* (2013.01); *H01L 21/28518* (2013.01);
(Continued)

(58) Field of Classification Search
CPC ................. H01L 29/45; H01L 21/0259; H01L 21/28518; H01L 21/30604; H01L 21/764;
(Continued)

(56) References Cited

U.S. PATENT DOCUMENTS 9,570,556 B1 * 2/2017 Lee .................... H01L 29/66795
10,847,373 B2 * 11/2020 Lin .................... H01L 29/66439
(Continued)

*Primary Examiner* — Matthew E. Gordon
*Assistant Examiner* — Sean Ayers Winters
(74) *Attorney, Agent, or Firm* — HAYNES AND BOONE, LLP

(57) ABSTRACT

Source/drain silicide that improves performance and methods for fabricating such are disclosed herein. An exemplary device includes a first channel layer disposed over a substrate, a second channel layer disposed over the first channel layer, and a gate stack that surrounds the first channel layer and the second channel layer. A source/drain feature disposed adjacent the first channel layer, second channel layer, and gate stack. The source/drain feature is disposed over first facets of the first channel layer and second facets of the second channel layer. The first facets and the second facets have a (111) crystallographic orientation. An inner spacer disposed between the gate stack and the source/drain feature and between the first channel layer and the second channel layer. A silicide feature is disposed over the source/drain feature where the silicide feature extends into the source/drain feature towards the substrate to a depth of the first channel layer.

20 Claims, 18 Drawing Sheets

(51) Int. Cl.
*H01L 21/285* (2006.01)
*H01L 21/306* (2006.01)
*H01L 21/764* (2006.01)
*H10D 30/01* (2025.01)
*H10D 30/67* (2025.01)
*H10D 62/00* (2025.01)
*H10D 62/10* (2025.01)
*H10D 64/01* (2025.01)

(52) U.S. Cl.
CPC ...... *H01L 21/30604* (2013.01); *H01L 21/764* (2013.01); *H10D 30/031* (2025.01); *H10D 30/6713* (2025.01); *H10D 30/6735* (2025.01); *H10D 30/6757* (2025.01); *H10D 62/021* (2025.01); *H10D 62/116* (2025.01); *H10D 62/118* (2025.01); *H10D 64/017* (2025.01); *H10D 64/018* (2025.01)

(58) Field of Classification Search
CPC ............ H01L 29/0653; H01L 29/0665; H01L 29/42392; H01L 29/66545; H01L 29/66553; H01L 29/66636; H01L 29/66742; H01L 29/78618; H01L 29/78696; H10D 64/62; H10D 62/116; H10D 30/6757; H10D 64/018; H10D 64/017; H10D 62/118; H10D 62/021; H10D 30/6713; H10D 30/6735; H10D 30/031

See application file for complete search history.

(56) References Cited

U.S. PATENT DOCUMENTS

| | | |
|---|---|---|
| 10,903,317 B1 | 1/2021 | Frougier |
| 2010/0327329 A1 | 12/2010 | Itokawa |
| 2013/0256664 A1 | 10/2013 | Qin |
| 2015/0170972 A1 | 6/2015 | Lim |
| 2017/0256639 A1 | 9/2017 | Lee |
| 2018/0053840 A1* | 2/2018 | Mallela ............... H01L 29/0649 |
| 2018/0175195 A1 | 6/2018 | Huang |
| 2018/0190810 A1* | 7/2018 | Li ....................... H01L 29/0847 |
| 2019/0035913 A1 | 1/2019 | Cheng |
| 2019/0067418 A1 | 2/2019 | Yang |
| 2019/0074362 A1 | 3/2019 | Lee |
| 2019/0081155 A1 | 3/2019 | Xie |
| 2019/0148515 A1 | 5/2019 | Cheng |
| 2019/0312050 A1* | 10/2019 | Lai ........................ H10B 43/27 |
| 2019/0348498 A1 | 11/2019 | Cheng |
| 2020/0006336 A1* | 1/2020 | Lung ....................... H01L 29/24 |
| 2020/0035784 A1 | 1/2020 | Lee |
| 2020/0035840 A1* | 1/2020 | Vellianitis ............. H01L 29/045 |
| 2020/0105619 A1 | 4/2020 | Lin |
| 2020/0105889 A1 | 4/2020 | Liaw |
| 2020/0227534 A1 | 7/2020 | Chiang |

* cited by examiner

SOURCE/DRAIN SILICIDE FOR MULTIGATE DEVICE PERFORMANCE AND METHOD OF FABRICATING THEREOF

PRIORITY DATA

The present application is a divisional application of U.S. patent application Ser. No. 17/231,925, filed on Apr. 15, 2021, which is herein incorporated by reference in its entirety.

BACKGROUND

The electronics industry has experienced an ever-increasing demand for smaller and faster electronic devices that are simultaneously able to support a greater number of increasingly complex and sophisticated functions. To meet these demands, there is a continuing trend in the integrated circuit (IC) industry to manufacture low-cost, high-performance, and low-power ICs. Thus far, these goals have been achieved in large part by reducing IC dimensions (for example, minimum IC feature size), thereby improving production efficiency and lowering associated costs. However, such scaling has also increased complexity of the IC manufacturing processes. Thus, realizing continued advances in IC devices and their performance requires similar advances in IC manufacturing processes and technology.

Recently, multigate devices have been introduced to improve gate control. Multigate devices have been observed to increase gate-channel coupling, reduce OFF-state current, and/or reduce short-channel effects (SCEs). One such multigate device is the gate-all around (GAA) device, which includes a gate structure that can extend, partially or fully, around a channel region to provide access to the channel region on at least two sides. GAA devices enable aggressive scaling down of IC technologies, maintaining gate control and mitigating SCEs, while seamlessly integrating with conventional IC manufacturing processes. As GAA devices continue to scale, challenges have arisen with the addition of multiple stacked channel layers, which challenges have been observed to degrade performance of the GAA devices.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
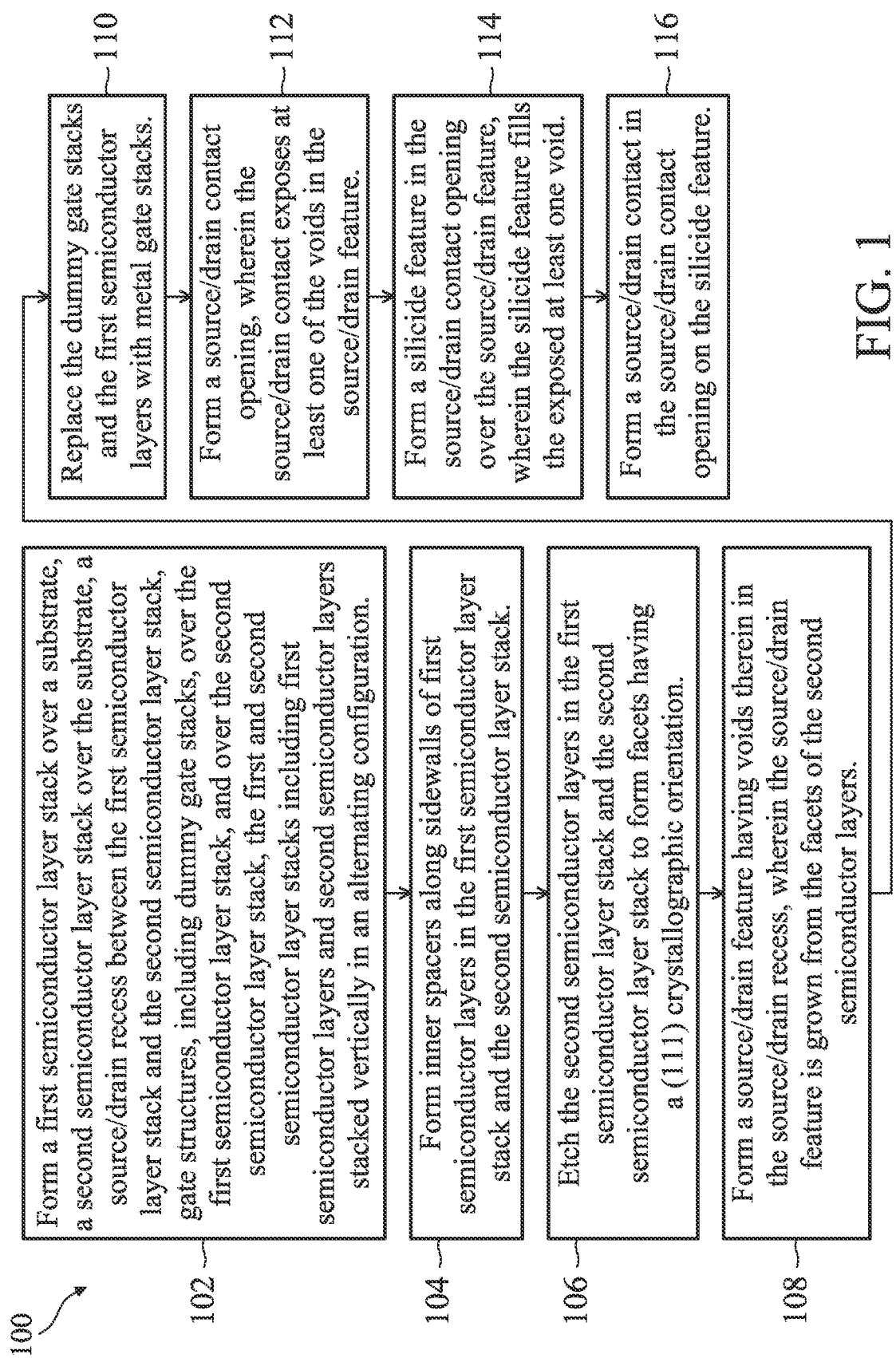
FIG. 1 is a flow chart of a method for fabricating a multigate device according to various aspects of the present disclosure.

The present disclosure relates generally to integrated circuit devices, and more particularly, to multigate devices, such as gate-all-around (GAA) devices.

The following disclosure provides many different embodiments, or examples, for implementing different features. Reference numerals and/or letters may be repeated in the various examples described herein. This repetition is for the purpose of simplicity and clarity and does not in itself dictate a relationship between the various disclosed embodiments and/or configurations. Further, specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. Moreover, the formation of a feature on, connected to, and/or coupled to another feature in the present disclosure may include embodiments in which the features are formed in direct contact, and may also include embodiments in which additional features may be formed interposing the features, such that the features may not be in direct contact.

Further, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used herein for ease of description to describe one element or feature's relationship to another element(s) or feature(s). The spatially relative terms are intended to encompass different orientations than as depicted of a device (or system or apparatus) including the element(s) or feature(s), including orientations associated with the device's use or operation. The apparatus may be otherwise oriented (rotated 90 degrees or at other orientations) and the spatially relative descriptors used herein may likewise be interpreted accordingly.

FIG. 1 is a flow chart of a method 100 for fabricating a multigate device according to various aspects of the present disclosure. In some embodiments, method 100 fabricates a multi-gate device that includes multiple voids in the source/drain region. At block 102, form a first semiconductor layer stack over a substrate, a second semiconductor layer stack over the substrate, and a source/drain recess between the first semiconductor layer stack and the second semiconductor layer stack. Form gate structures, including dummy gate stacks, over the first semiconductor layer stack and over the second semiconductor layer stack. The first and second semiconductor layer stacks including first semiconductor layers and second semiconductor layers stacked vertically in an alternating configuration. At block 104, form inner spacers along sidewalls of first semiconductor layers in the first semiconductor layer stack and the second semiconductor layer stack. At block 106, etch the second semiconductor layers in the first semiconductor layer stack and the second semiconductor layer stack to form facets having a (111) crystallographic orientation. At block 108, form a source/drain feature having voids therein in the source/drain recess, wherein the source/drain feature is grown from the facets of the second semiconductor layers. At block 110, replace the dummy gate stacks and the first semiconductor layers with metal gate stacks. At block 112, form a source/drain contact opening, wherein the source/drain contact exposes at least one of the voids in the source/drain feature. At block 114, form a silicide feature in the source/drain contact opening over the source/drain feature, wherein the silicide feature fills the exposed at least one void. At block 116, form a source/drain contact in the source/drain contact opening on the silicide feature.

FIGS. 2A-2H are diagrammatic cross-sectional views of a multigate device 200 at various stages of fabrication (such as those associated with method 100 in FIG. 1) according to various aspects of the present disclosure. Multigate device 200 may be included in a microprocessor, a memory, and/or other IC device. In some embodiments, multigate device 200 is a portion of an IC chip, a system on chip (SoC), or portion thereof, that includes various passive and active microelectronic devices such as resistors, capacitors, inductors, diodes, p-type field effect transistors (PFETs), n-type field effect transistors (NFETs), metal-oxide semiconductor field effect transistors (MOSFETs), complementary metal-oxide semiconductor (CMOS) transistors, bipolar junction transistors (BJTs), laterally diffused MOS (LDMOS) transistors, high voltage transistors, high frequency transistors, other suitable components, or combinations thereof. In some embodiments, multigate device 200 is included in a non-volatile memory, such as a non-volatile random access memory (NVRAM), a flash memory, an electrically erasable programmable read only memory (EEPROM), an electrically programmable read-only memory (EPROM), other suitable memory type, or combinations thereof. FIGS. 2A-2H have been simplified for the sake of clarity to better understand the inventive concepts of the present disclosure. Additional features can be added in multigate device 200, and some of the features described below can be replaced, modified, or eliminated in other embodiments of multigate device 200.

Figure 2A:
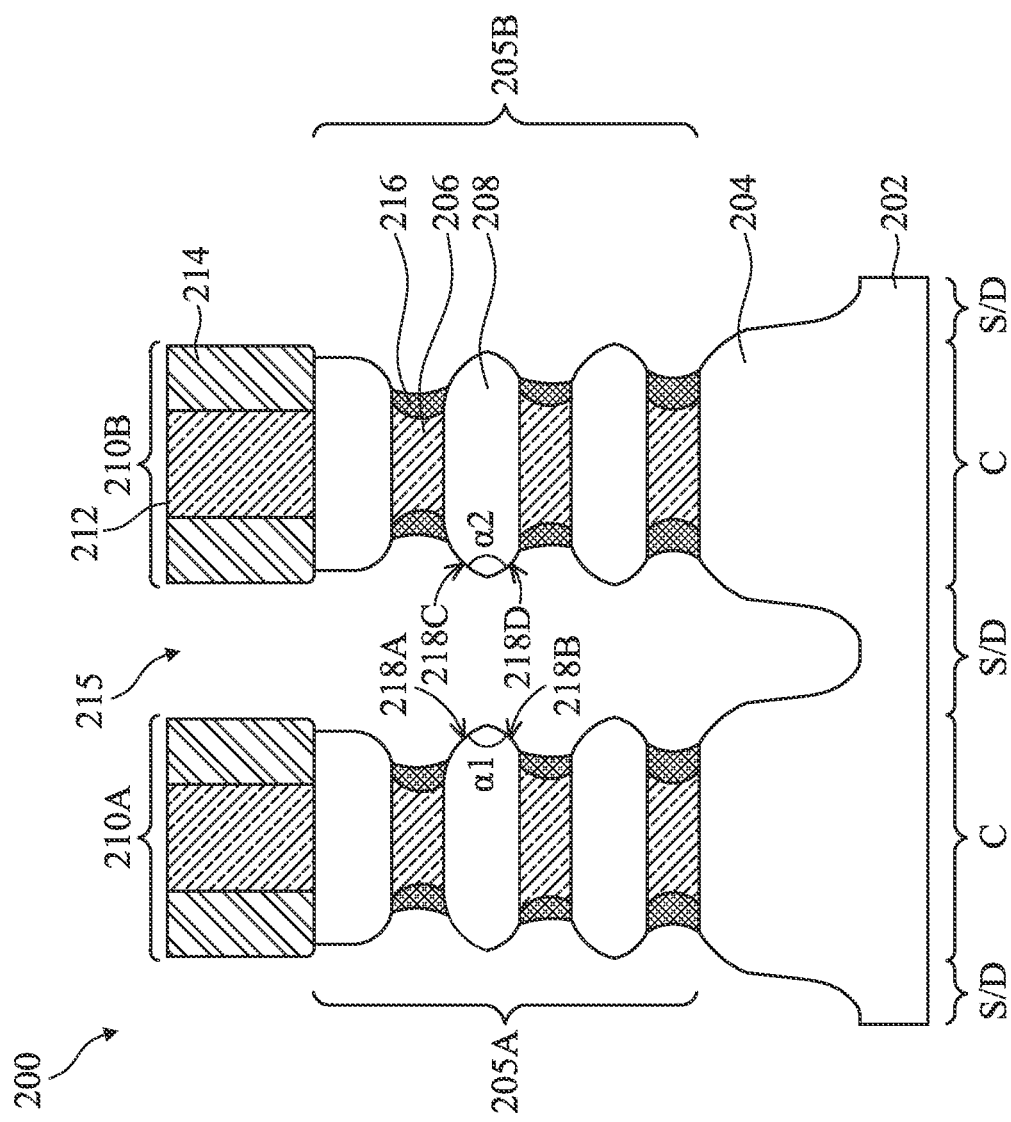
FIGS. 2A-2H are diagrammatic cross-sectional views of a multigate device at various fabrication stages (such as those associated with the method in FIG. 1) according to various aspects of the present disclosure.

Turning to FIG. 2A, multigate device 200 includes a substrate (wafer) 202. In the depicted embodiment, substrate 202 includes silicon. Alternatively or additionally, substrate 202 includes another elementary semiconductor, such as germanium; a compound semiconductor, such as silicon carbide, gallium arsenide, gallium phosphide, indium phosphide, indium arsenide, and/or indium antimonide; an alloy semiconductor, such as silicon germanium (SiGe), GaAsP, AlInAs, AlGaAs, GaInAs, GaInP, and/or GaInAsP; or combinations thereof. Alternatively, substrate 202 is a semiconductor-on-insulator substrate, such as a silicon-on-insulator (SOI) substrate, a silicon germanium-on-insulator (SGOI) substrate, or a germanium-on-insulator (GOI) substrate. Semiconductor-on-insulator substrates can be fabricated using separation by implantation of oxygen (SIMOX), wafer bonding, and/or other suitable methods. Substrate 202 can include various doped regions depending on design requirements of multigate device 200.

In some embodiments, a substrate extension 204 may be formed over substrate 202. Substrate extension 204 may include silicon or another elementary semiconductor as described above with respect to substrate 202. Substrate extension 204 and substrate 202 may be formed of the same semiconductor material. Substrate extension 204 and substrate 202 may be formed of different semiconductor material.

A semiconductor layer stack 205A and a semiconductor layer stack 205B are disposed over respective substrate extensions 204 in channel regions C of multigate device 200. Channel regions C are disposed between respective source/drain S/D regions of multigate device 200. Semiconductor layer stacks 205A, 205B include semiconductor layers 206 and semiconductor layers 208 stacked vertically (e.g., along the z-direction) in an interleaving or alternating configuration from a surface of substrate 202. In some embodiments, semiconductor layers 206 and semiconductor layers 208 are epitaxially grown in the depicted interleaving and alternating configuration. For example, a first one of semiconductor layers 206 is epitaxially grown on substrate 202, a first one of semiconductor layers 208 is epitaxially grown on the first one of semiconductor layers 206, a second one of semiconductor layers 206 is epitaxially grown on the first one of semiconductor layers 208, and so on until semiconductor layer stacks 205A, 205B have a desired number of semiconductor layers 206 and semiconductor layers 208. In such embodiments, semiconductor layers 206 and semiconductor layers 208 can be referred to as epitaxial layers. In some embodiments, epitaxial growth of semiconductor layers 206 and semiconductor layers 208 is achieved by a molecular beam epitaxy (MBE) process, a chemical vapor deposition (CVD) process, a metalorganic chemical vapor deposition (MOCVD) process, other suitable epitaxial growth process, or combinations thereof.

A composition of semiconductor layers 206 is different than a composition of semiconductor layers 208 to achieve etching selectivity and/or different oxidation rates during subsequent processing. In some embodiments, semiconductor layers 206 have a first etch rate to an etchant and semiconductor layers 208 have a second etch rate to the etchant, where the second etch rate is less than the first etch rate. In some embodiments, semiconductor layers 206 have a first oxidation rate and semiconductor layers 208 have a second oxidation rate, where the second oxidation rate is less than the first oxidation rate. In the depicted embodiment, semiconductor layers 206 and semiconductor layers 208 include different materials, constituent atomic percentages, constituent weight percentages, thicknesses, and/or characteristics to achieve desired etching selectivity during an etching process, such as an etching process implemented to form suspended channel layers in channel regions of multigate device 200. For example, where semiconductor layers 206 include silicon germanium and semiconductor layers 208 include silicon, a silicon etch rate of semiconductor layers 208 is less than a silicon germanium etch rate of semiconductor layers 206. In some embodiments, semiconductor layers 206 and semiconductor layers 208 can include the same material but with different constituent atomic percentages to achieve the etching selectivity and/or different oxidation rates. For example, semiconductor layers 206 and semiconductor layers 208 can include silicon germanium, where semiconductor layers 206 have a first silicon atomic percent and/or a first germanium atomic percent and semiconductor layers 208 have a second, different silicon atomic percent and/or a second, different germanium atomic percent. The present disclosure contemplates that semiconductor layers 206 and semiconductor layers 208 include any combination of semiconductor materials that can provide desired etching selectivity, desired oxidation rate differences, and/or desired performance characteristics (e.g., materials that maximize current flow), including any of the semiconductor materials disclosed herein.

As described further below, semiconductor layers 208 or portions thereof form channel regions of multigate device 200. In the depicted embodiment, semiconductor layer stack 205 includes three semiconductor layers 206 and three semiconductor layers 208 configured to form three semiconductor layer pairs disposed over substrate 202, each semiconductor layer pair having a respective semiconductor layer 206 and a respective semiconductor layer 208. After undergoing subsequent processing, such configuration will result in multigate device 200 having three channels. However, the present disclosure contemplates embodiments where semiconductor layer stack 205 includes more or less semiconductor layers, for example, depending on a number of channels desired for multigate device 200 (e.g., a GAA transistor) and/or design requirements of multigate device 200. For example, semiconductor layer stack 205 can include two to ten semiconductor layers 206 and two to ten semiconductor layers 208.

Gate structures 210A, 210B are disposed over semiconductor layer stacks 205A, 205B, respectively. In some embodiments, gate structures 210A, 210B extend substantially parallel to one another along an x-direction, having a length defined in the x-direction, a width defined in a y-direction, and a height defined in a z-direction. In such embodiments, in the Y-Z plane, gate structures 210A, 210B are disposed over top surfaces of respective channel regions C of multigate device 200, such that gate structures 210A, 210B interpose respective source/drain regions S/D, such as depicted in FIG. 2A. In furtherance of such embodiments, in the X-Z plane, gate structures 210A, 210B wrap top surfaces and sidewall surfaces of semiconductor layer stacks 205A, 205B and, in some embodiments, sidewall surfaces of substrate extensions 204. Each of gate structures 210A, 210B includes a dummy gate stack 212 and gate spacers 214. Dummy gate stacks 212 include a dummy gate electrode, and in some embodiments, a dummy gate dielectric. The dummy gate electrode includes a suitable dummy gate material, such as a polysilicon layer. In embodiments where dummy gate stacks 212 include a dummy gate dielectric disposed between the dummy gate electrode and semiconductor layer stacks 205A, 205B, the dummy gate dielectric includes a dielectric material, such as silicon oxide, a high-k dielectric material, other suitable dielectric material, or combinations thereof. Examples of high-k dielectric material include HfO2, HfSiO, HfSiON, HfTaO, HfTiO, HfZrO, zirconium oxide, aluminum oxide, hafnium dioxide-alumina (HfO2-Al2O3) alloy, other suitable high-k dielectric materials, or combinations thereof. In some embodiments, the dummy gate dielectric includes an interfacial layer (including, for example, silicon oxide) disposed over semiconductor layer stacks 205A, 205B and a high-k dielectric layer disposed over the interfacial layer. Dummy gate stacks 212 can include numerous other layers, for example, capping layers, interface layers, diffusion layers, barrier layers, hard mask layers, or combinations thereof. For example, dummy gate stacks 212 can further include a hard mask layer disposed over the dummy gate electrode.

Gate spacers 214 are disposed adjacent to (i.e., along sidewalls of) respective dummy gate stacks 212. Gate spacers 212 are formed by any suitable process and include a dielectric material. The dielectric material can include silicon, oxygen, carbon, nitrogen, other suitable material, or combinations thereof (e.g., silicon oxide, silicon nitride, silicon oxynitride (SiON), silicon carbide, silicon carbon nitride (SiCN), silicon oxycarbide (SiOC), silicon oxycarbon nitride (SiOCN)). For example, a dielectric layer including silicon and nitrogen, such as a silicon nitride layer, can be deposited over dummy gate stacks 212 and subsequently etched (e.g., anisotropically etched) to form gate spacers 214. In some embodiments, gate spacers 214 include a multi-layer structure, such as a first dielectric layer that includes silicon nitride and a second dielectric layer that includes silicon oxide. In some embodiments, more than one set of spacers, such as seal spacers, offset spacers, sacrificial spacers, dummy spacers, and/or main spacers, are formed adjacent to dummy gate stacks 212. In such implementations, the various sets of spacers can include materials having different etch rates. For example, a first dielectric layer including silicon and oxygen (e.g., silicon oxide) can be deposited and etched to form a first spacer set adjacent to dummy gate stacks 212, and a second dielectric layer including silicon and nitrogen (e.g., silicon nitride) can be deposited and etched to form a second spacer set adjacent to the first spacer set.

At the stage of processing in FIG. 2A, source/drain recesses 215 have been formed in source/drain regions S/D of multigate device 200, for example, by an etching process. Gate structures 210A, 210B are thus disposed between respective source/drain recesses 215. In the depicted embodiment, source/drain recesses 215 are formed by an etching process that completely removes a portion of semiconductor layers 206 and semiconductor layers 208 in source/drain regions S/D of multigate device 200 and partially removes a portion of substrate 202 in source/drain regions S/D of multigate device 200, thereby forming semiconductor layer stacks 205A, 205B and substrate extensions 204 in the channel regions C of multigate device 200. After the source/drain etching process, source/drain recesses 215 have sidewalls defined by remaining portions of semiconductor layers 206 and semiconductor layers 208 in channel regions C (i.e., semiconductor layer stacks 205A, 205B) and bottoms defined by substrate 202. In some embodiments, the etching process removes some, but not all, of the portion of semiconductor layers 206 and semiconductor layers 208 in source/drain regions S/D, such that source/drain recesses 215 have a bottom defined by one of semiconductor layers 206 or semiconductor layers 208. In some embodiments, the etching process further removes some, but not all, of substrate 202, such that source/drain recesses 215 extend below a topmost surface of substrate 202. The etching process can include a dry etching process, a wet etching process, other suitable etching process, or combinations thereof. In some embodiments, the etching process is a multi-step etch process. For example, the etching process may alternate etchants to separately and alternately remove semiconductor layers 206 and semiconductor layers 208. In some embodiments, parameters of the etching process are configured to selectively etch semiconductor layers 206 and semiconductor layers 208 with minimal (to no) etching of dummy gate stacks 212 and gate spacers 214. In some embodiments, a lithography process, such as those described herein, is performed to form a patterned mask layer that covers dummy gate stacks 212 and gate spacers 214 and the etching process uses the patterned mask layer as an etch mask.

After forming source/drain recesses 215, the present disclosure proposes using a facet etch process to configure surfaces of semiconductor layers 208 in a manner that enhances subsequent semiconductor growth, such as epitaxial semiconductor growth, from semiconductor layers 208 when forming epitaxial source/drain features. For example, the facet etch process is tuned to minimally etch semiconductor layers 208 to achieve facets of semiconductor layers 208 in source/drain recesses 215 that promote epitaxial growth that will merge in portions of source/drain recesses 215 without merging in other portions of source/drain recesses 215, such that voids can be formed in epitaxial source/drain features. In the depicted embodiment, after the facet etch process, semiconductor layers 208 of semiconductor layer stack 205A have facets 218A and facets 218B, and semiconductor layers 208 of semiconductor layer stack 205B have facets 218C and facets 218D. Each of facets 218A-218D have a (111) crystallographic orientation, which facilitates subsequent growth of epitaxial source/drain features in a manner as described herein. An angle α1 is between facets 218A and facets 218B, and an angle α2 is between facets 218C and facets 218D. In some embodiments, angle α1 and angle α2 are about 90° to about 130°. In some embodiments, semiconductor layers 208 of semiconductor layer stacks 205A, 205B may begin with three facets, such as a first facet having a (100) crystallographic orientation, a second facet having a (110) crystallographic orientation, and a third facet having a (100) crystallographic orientation, where the second facet extends from the first facet to the third facet. In such embodiments, the facet etch process is controlled to remove portions of semiconductor layers 208 and achieve facets 218A-218D having the (111) crystallographic orientation. Various etch parameters can be tuned to achieve the desired facet etching of semiconductor layers 208, such as etch gas composition, carrier gas composition, etch gas flow rate, carrier gas flow rate, etch time, etch pressure, etch temperature, source power, radio frequency (RF) and/or direct current (DC) bias voltage, RF and/or DC bias power, other suitable etch parameters, or combinations thereof. In some embodiments, a wet etching process is performed that uses one or more wet etch chemicals such as ozone (O3), SCA (H2O2 based), ammonium hydroxide (NH4OH), tetramethylammonium hydroxide (TMAH), or other suitable wet etch chemical, to selectively etch the semiconductor layers 208 to expose facets 218A-218D having the (111) crystallographic orientation.

After forming facets 218A-218D, inner spacers 216 are formed along sidewalls of semiconductor layers 206 of semiconductor layer stacks 205A, 205B by an inner spacer deposition and etch process. For example, a first etching process is performed that selectively etches semiconductor layers 206 exposed by source/drain recesses 215 with minimal (to no) etching of semiconductor layers 208, such that gaps are formed between semiconductor layers 208 and between semiconductor layers 208 and substrate 202 under gate spacers 214. Portions (edges) of semiconductor layers 208 are thus suspended under gate spacers 214. In some embodiments, the gaps extend partially under dummy gate stacks 212. The first etching process is configured to laterally etch (e.g., along the y-direction) semiconductor layers 206, thereby reducing a length of semiconductor layers 206 along the y-direction. The first etching process is a dry etching process, a wet etching process, other suitable etching process, or combinations thereof. A deposition process then forms a spacer layer over dummy gate stacks 212, gate spacers 214, and over features defining source/drain recesses 215 (e.g., semiconductor layers 208, semiconductor layers 206, and substrate 202), such as CVD, PVD, ALD, HDPCVD, MOCVD, RPCVD, PECVD, LPCVD, ALCVD, APCVD, plating, other suitable methods, or combinations thereof. The spacer layer partially (and, in some embodiments, completely) fills the source/drain recesses 215. The deposition process is configured to ensure that the spacer layer fills the gaps between semiconductor layers 208 and between semiconductor layers 208 and substrate 202 under gate spacers 214. A second etching process is then performed that selectively etches the spacer layer to form inner spacers 210 as depicted in FIG. 2A with minimal (to no) etching of semiconductor layers 208, dummy gate stacks 212, and gate spacers 214. In some embodiments, the spacer layer is removed from sidewalls of gate spacers 214, sidewalls of semiconductor layers 208, dummy gate stacks 212, and substrate 202. The spacer layer (and thus inner spacers 216) includes a material that is different than a material of semiconductor layers 208 and a material of gate spacers 214 to achieve desired etching selectivity during the second etching process. In some embodiments, the spacer layer includes a dielectric material that includes silicon, oxygen, carbon, nitrogen, other suitable material, or combinations thereof (for example, silicon oxide, silicon nitride, silicon oxynitride, silicon carbide, or silicon oxycarbonitride). In some embodiments, the spacer layer includes a low-k dielectric material, such as those described herein. In some embodiments, dopants (for example, p-type dopants, n-type dopants, or combinations thereof) are introduced into the dielectric material, such that spacer layer includes a doped dielectric material.

Turning to FIGS. 2B-2E, processing proceeds with forming epitaxial source/drain features in source/drain recesses 215. As described below, the epitaxial source/drain features have characteristics that improve/enhance contact formation and improve performance of multigate device 200. For example, referring to FIGS. 2B-2D, a first epitaxial layer 220 is formed in source/drain recesses 215. First epitaxial layer 220 partially fills source/drain recesses 215. For example, a semiconductor material is epitaxially grown from portions of substrate 202 and semiconductor layers 208 exposed by source/drain recesses 215, forming first epitaxial layer 220 in source/drain recesses 215. An epitaxy process can use CVD deposition techniques (for example, VPE and/or UHV-CVD), molecular beam epitaxy, other suitable epitaxial growth processes, or combinations thereof. The epitaxy process can use gaseous and/or liquid precursors, which interact with the composition of substrate 202 and/or semiconductor layers 208. First epitaxial layer 220 may be doped with n-type dopants and/or p-type dopants. In some embodiments, for n-type GAA transistors, first epitaxial layer 220 includes silicon. In such embodiments, first epitaxial layer 220 can be doped with carbon, phosphorous, arsenic, other n-type dopant, or combinations thereof (for example, forming Si:C epitaxial source/drain features, Si:P epitaxial source/drain features, or Si:C:P epitaxial source/drain features). In some embodiments, for p-type GAA transistors, first epitaxial layer 220 includes silicon germanium or germanium. In such embodiments, first epitaxial layer 220 can be doped with boron, other p-type dopant, or combinations thereof (for example, forming Si:Ge:B epitaxial source/drain features). In some embodiments, first epitaxial layer 220 includes more than one epitaxial semiconductor layer, where the epitaxial semiconductor layers can include the same or different materials and/or dopant concentrations. In some embodiments, first epitaxial layer 220 includes materials and/or dopants that achieve desired tensile stress and/or compressive stress in channel regions. In some embodiments, first epitaxial layer 220 is doped during deposition by adding impurities to a source material of the epitaxy process (i.e., in-situ). In some embodiments, first epitaxial layer 220 is doped by an ion implantation process subsequent to a deposition process. In some embodiments, annealing processes (e.g., rapid thermal annealing (RTA) and/or laser annealing) are performed to activate dopants in first epitaxial layer 220 and/or other source/drain regions (for example, heavily doped source/drain regions and/or lightly doped source/drain (LDD) regions). In some embodiments, first epitaxial layer 220 is formed in separate processing sequences, for example, each of FIGS. 2B-2D may depict a separate step in the epitaxy process. In other embodiments, first epitaxial layer 220 is formed in a single process, for example FIGS. 2B-2D may collectively depict the epitaxy process when configured as one-step.

Figure 2B:
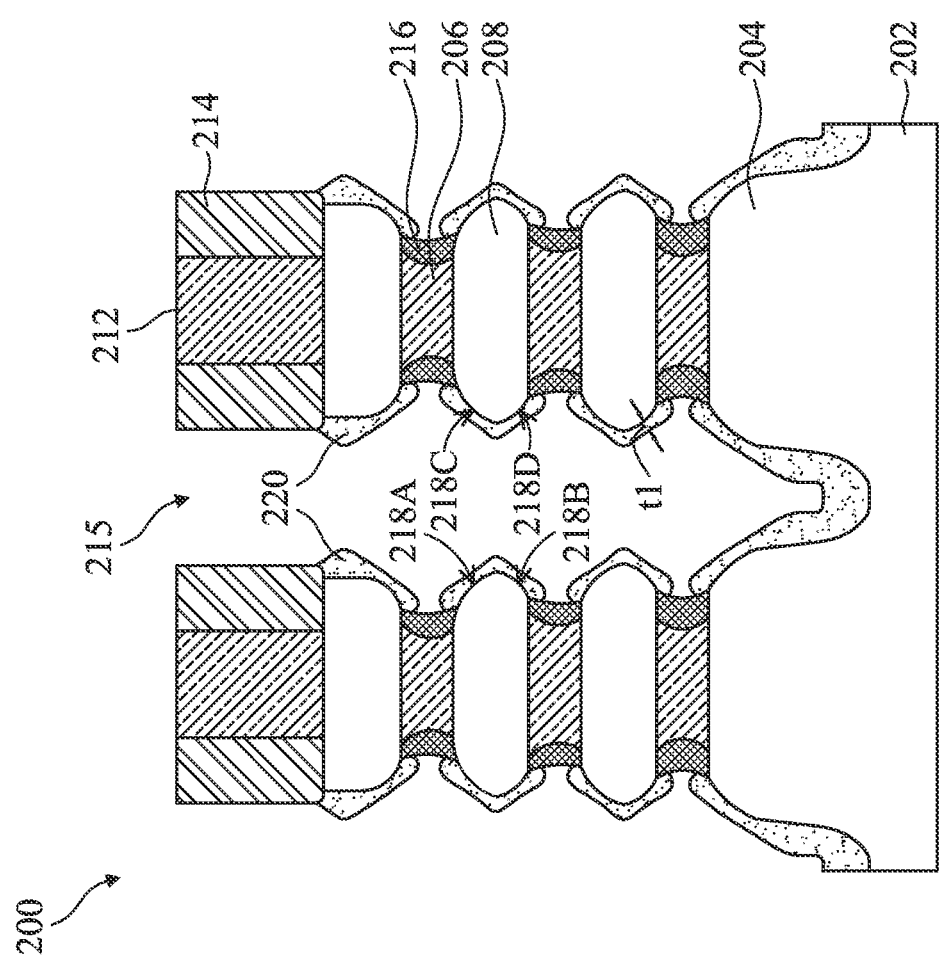

Turning to FIG. 2B, first epitaxial layer 220 is formed on semiconductor layers 208 (in particular, on (111) facets 218A-218D of semiconductor layers 208) and on substrate 202 in source/drain recesses 215. In some embodiments, the epitaxy process is performed until first epitaxial layer 220 covers exposed surfaces of semiconductor layers 208 and substrate 202 in source/drain recesses 215. In the depicted embodiment, first epitaxial layer 220 includes separate portions that are not connected (or merged) to one another. For example, since first epitaxial layer 220 is not formed on inner spacers 216, portions of first epitaxial layer 220 disposed on adjacent semiconductor layers 208 are not connected to one another and portions of first epitaxial layer 220 formed on substrate 202 are not connected to portions of first epitaxial layer 220 formed on semiconductor layers 208. In some embodiments, first epitaxial layer 220 has a first thickness t1 on facets 218A-218D. In FIG. 2B, the source/drain recesses 215 are now defined by first epitaxial layer 220 and inner spacers 216.

Figure 2C:
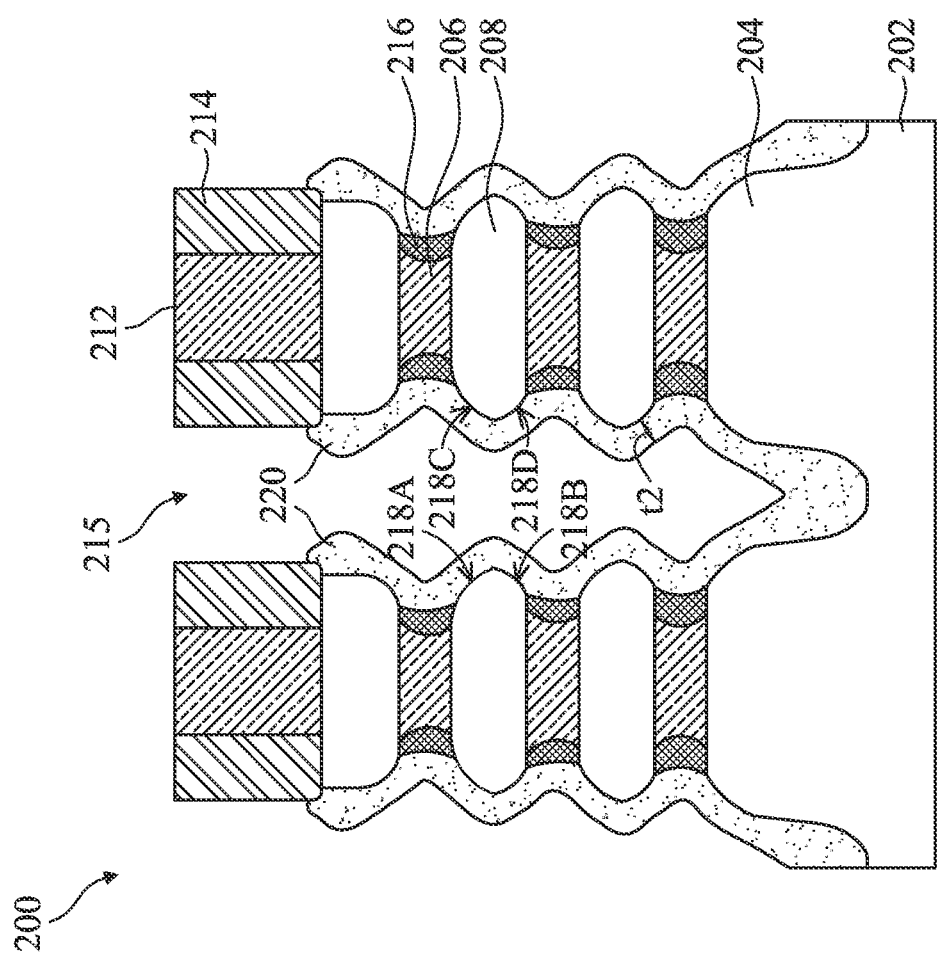

Turning to FIG. 2C, first epitaxial layer 220 formation continues in the source/drain recesses 215, such that the portions of first epitaxial layer 220 merge into a continuous layer in source/drain recesses 215. In some embodiments, first epitaxial layer 220 has a thickness t2 that is greater than thickness t1. In some embodiments, first epitaxial layer 220 may be formed to thickness t2 as part of the same process used to form first epitaxial layer 220 to thickness t1. In some embodiments, first epitaxial layer 220 may be formed to thickness t2 in a separate process than used to form first epitaxial layer 220 to thickness t1. The source/drain recesses 215 are now defined solely by the first epitaxial layer 220.

Figure 2D:
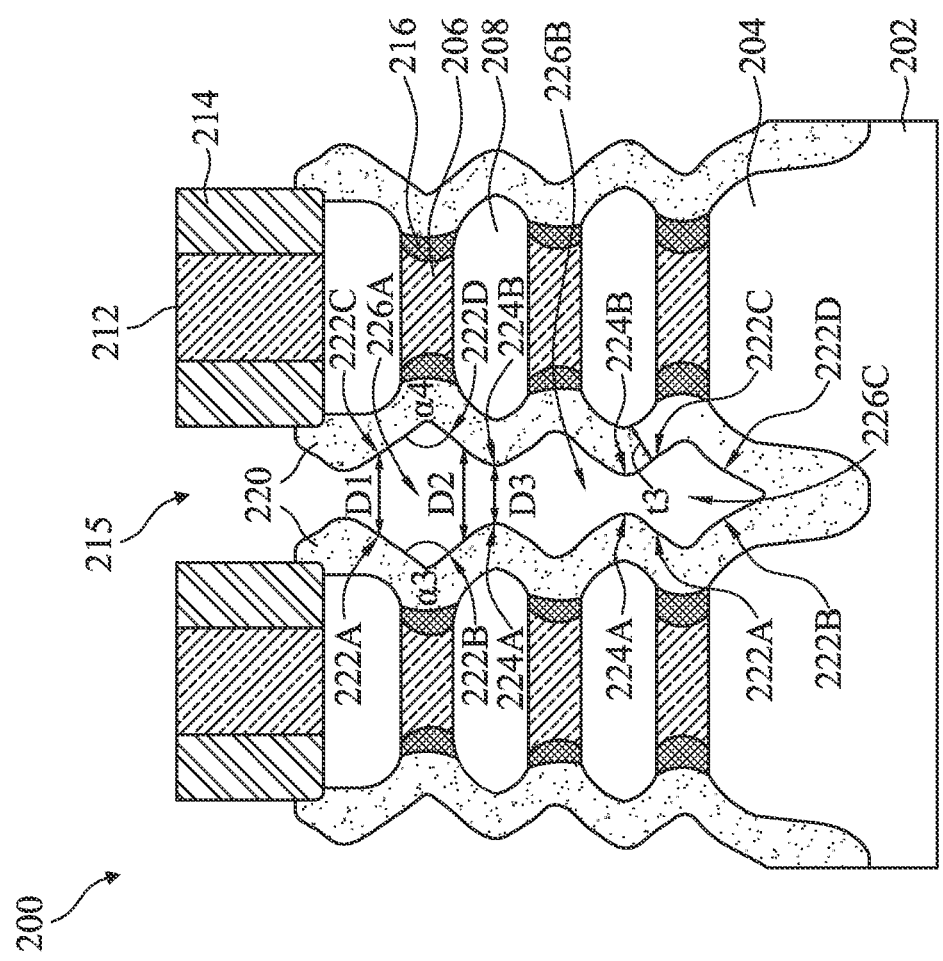

Turning to FIG. 2D, first epitaxial layer 220 formation continues in the source/drain recesses 215. In some embodiments, the first epitaxial layer 220 has a thickness t3 that is greater than thickness t2. In some embodiments, thickness t3 is about 2 nm to about 10 nm. In some embodiments, first epitaxial layer 220 may be formed to thickness t3 in the same process used to form first epitaxial layer 220 to thickness t2. In some embodiments, first epitaxial layer 220 may be formed to thickness t3 in a separate process than used to form first epitaxial layer 220 to thickness t2. First epitaxial layer 220 has facets 222A, facets 222B, facets 222C, facets 222D, facets 224A, and facets 224B. In the depicted embodiment, facets 222A-222D of first epitaxial layer 220 have a (111) crystallographic orientation and facets 224A-224B of first epitaxial layer 220 have a (100) crystallographic orientation. Facets 222A and facets 222D extend along a first direction, and facets 222B and facets 222C extend along a second direction that is different than the first direction. In some embodiments, facets 222A and facets 222D are substantially parallel to one another, and facets 222B and facets 222C are substantially parallel to one another. Facets 222A and facets 222C are separated by a distance D1, and facets 222B and facets 222D are separated by a distance D2. Distance D1 increases along a direction perpendicular to a top surface of substrate 202 (for example, the z-direction). Distance D2 decreases along the direction perpendicular to the top surface of substrate 202. An angle α3 is between facets 222A and facets 222B, and an angle α4 is between facets 222C and facets 222D. In some embodiments, angle α3 and angle α4 are about 90° to about 130°. In the depicted embodiment, facets 222A-222D of first epitaxial layer 220 define a void portion 226A, a void portion 226B, and a void portion 226C of source/drain recesses 215. For example, each of void portions 226A-226C is defined by a respective one of facets 222A, a respective one of facets 222B, a respective one of facets 222C, and a respective one of facets 222D. In some embodiments, void portions 226A-226C have a diamond-like shape. Facets 224A, 224B of first epitaxial layer 220 are disposed between facets 222A-222D and void portions 226A-226C. For example, facets 224A extend from facets 222B to facets 222A and facets 224B extend from facets 222D to facets 222C. Facets 224A and facets 224B are separated by a distance D3, which is less than distance D1 and distance D2. In the depicted embodiment, facets 222A-222D and facets 224A, 224B of first epitaxial layer 220 define three void portions 226A-226C of source/drain recesses 215, though the present disclosure contemplates embodiments where more or less void portions are defined by first epitaxial layer 220. The epitaxy process of first epitaxial layer 220 is tuned to ensure that distance D3 is sufficiently small compared to distance D2 and distance D1 to achieve merging of a subsequently formed epitaxial layer between facets 224A, 224B before filling void portions 226A-226C. For example, a growth rate and/or growth time of a first epitaxial material of first epitaxial layer 220 can be controlled to achieve desired distance D3, distance D1, and/or distance D2. In some embodiments, various parameters of the epitaxy process, such as time, temperature, and pressure may be tuned to achieve the desired distances D1, D2, and D3. Source/drain recesses 215 are now defined by first epitaxial layer 220.

Figure 2E:
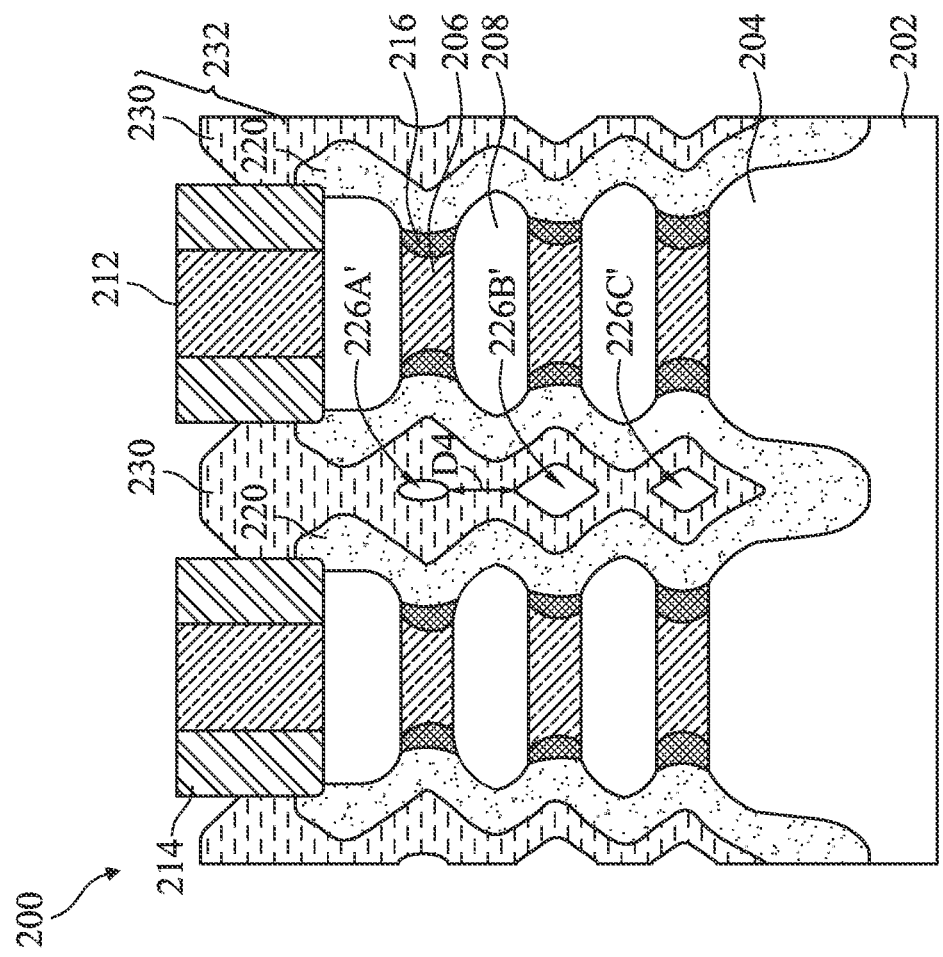

Turning to FIG. 2E, second epitaxial layer 230 is formed on first epitaxial layer 220 in source/drain recesses 215. Second epitaxial layer 230 fills a remainder of source/drain recesses 215 and, in the depicted embodiment, overfills source/drain recesses 215, such that a portion of second epitaxial layer 230 is disposed between gate structures 210A, 210B. Second epitaxial layer 230 and first epitaxial layer 220 collectively form epitaxial source/drain features 232 of multigate device 200. An epitaxy process can use CVD deposition techniques (for example, VPE and/or UHV-CVD), molecular beam epitaxy, other suitable epitaxial growth processes, or combinations thereof. The epitaxy process can use gaseous and/or liquid precursors, which interact with the composition of first epitaxial layer 220. Second epitaxial layer 230 may be doped with n-type dopants and/or p-type dopants. In some embodiments, for n-type GAA transistors, second epitaxial layer 230 includes silicon. In such embodiments, second epitaxial layer 230 can be doped with carbon, phosphorous, arsenic, other n-type dopant, or combinations thereof (for example, forming Si:C epitaxial source/drain features, Si:P epitaxial source/drain features, or Si:C:P epitaxial source/drain features). In some embodiments, for p-type GAA transistors, second epitaxial layer 230 includes silicon germanium or germanium. In such embodiments, second epitaxial layer 230 can be doped with boron, other p-type dopant, or combinations thereof (for example, forming Si:Ge:B epitaxial source/drain features). In some embodiments, second epitaxial layer 230 includes more than one epitaxial semiconductor layer, where the epitaxial semiconductor layers can include the same or different materials and/or dopant concentrations. In some embodiments, second epitaxial layer 230 includes materials and/or dopants that achieve desired tensile stress and/or compressive stress in channel regions. In some embodiments, second epitaxial layer 230 is doped during deposition by adding impurities to a source material of the epitaxy process (i.e., in-situ). In some embodiments, second epitaxial layer 230 is doped by an ion implantation process subsequent to a deposition process. In some embodiments, annealing processes (e.g., rapid thermal annealing (RTA) and/or laser annealing) are performed to activate dopants in second epitaxial layer 230 and/or other source/drain regions (for example, heavily doped source/drain regions and/or lightly doped source/drain (LDD) regions).

In some embodiments, second epitaxial layer 230 is formed of the same material as the first epitaxial layer 220. In some embodiments, second epitaxial layer 230 is formed of a different material than first epitaxial layer 220. In some embodiments, a doping concentration of a dopant in second epitaxial layer 230 is different (for example, greater or less) than a doping concentration of the dopant in first epitaxial layer 220. During the epitaxy process, because distance D3 is less than distance D1 and distance D2, second epitaxial layer 230 merges between facets 224A and facets 224B of first epitaxial layer 220 before completely filling void portions 226A-226C of source/drain recesses 215, thereby forming void 226A', void 226B', and 226C' in second epitaxial layer 230. The epitaxy process of first epitaxial layer 220 is tuned to ensure that distance D3 between facets 224A, 224B is sufficiently small compared to distance D2 and distance D1 so that second epitaxial layer 230 merges between facets 224A, 224B before filling void portions 226A-226C. Voids 226A'-226C' (also referred to as air gaps) are a remainder of void portions 226A-226C that are not filled by second epitaxial layer 230 and are separated by merged portions of second epitaxial layer 230. In the depicted embodiment, each of voids 226A'-226C' is defined between a respective pair of inner spacers 216 and semiconductor layers 206, while each of the merged portions of second epitaxial layer 230 is defined between a respective pair of semiconductor layers 208. Voids 226A'-226C' have any suitable shape depending on desired silicide formation, as described further below, and voids 226A'-226C' can have the same shape/profile or different shapes/profiles. In the depicted embodiment, void 226A' is oval-shaped while void 226B' and void 226C' are diamond-shaped. In some embodiments, voids 226A'-226C' are all diamond-shaped. In some embodiments, voids 226A'-226C' are all oval-shaped. The present disclosure contemplates various shapes for voids 226A'-226C'. In some embodiments, a vertical spacing D4 between adjacent voids is about 5 nm to about 10 nm.

Figure 2F:
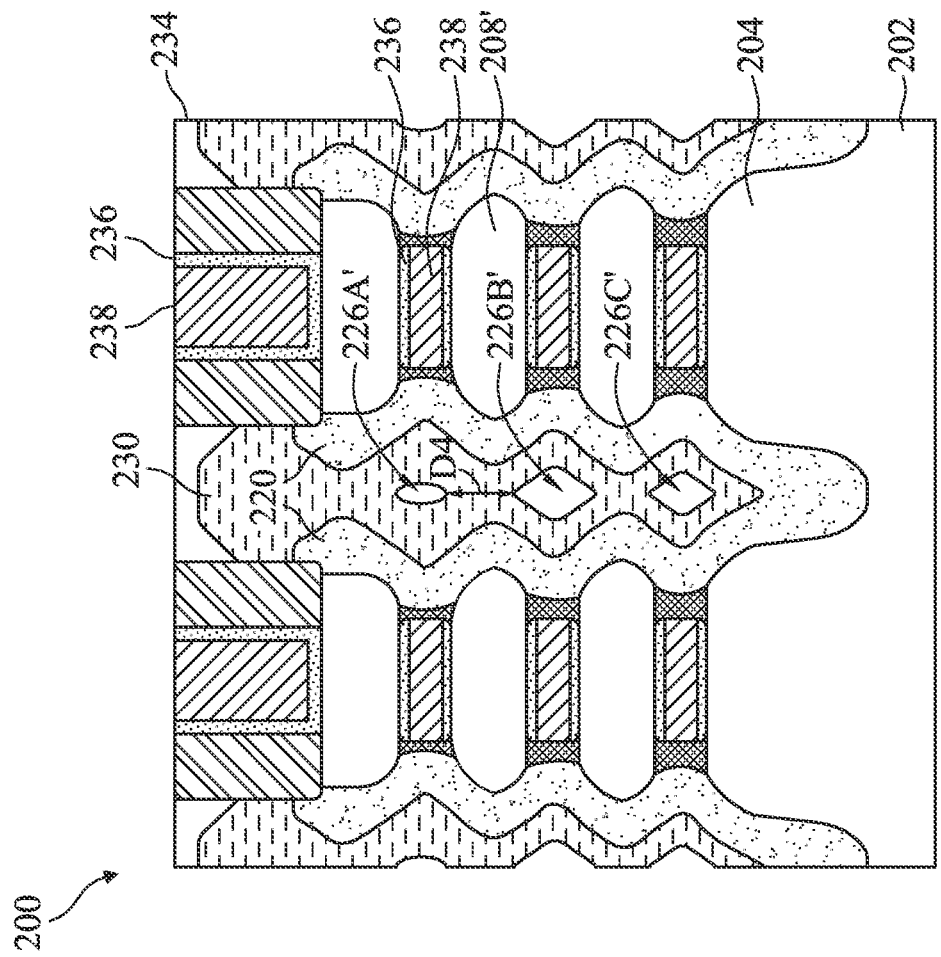

Turning to FIG. 2F, an inter-level dielectric (ILD) layer 234 is formed over epitaxial source/drain features 232 (in particular, second epitaxial layer 230), dummy gates 212, and gate spacers 214, for example, by a deposition process (such as CVD, PVD, ALD, HDPCVD, MOCVD, RPCVD, PECVD, LPCVD, ALCVD, APCVD, plating, other suitable methods, or combinations thereof). In some embodiments, ILD layer 234 is formed by a flowable CVD (FCVD) process that includes, for example, depositing a flowable material (such as a liquid compound) over multigate device 200 and converting the flowable material to a solid material by a suitable technique, such as thermal annealing and/or ultraviolet radiation treating. ILD layer 234 includes a dielectric material including, for example, silicon oxide, silicon nitride, silicon oxynitride, TEOS formed oxide, PSG, BPSG, low-k dielectric material, other suitable dielectric material, or combinations thereof. Exemplary low-k dielectric materials include FSG, carbon doped silicon oxide, Black Diamond® (Applied Materials of Santa Clara, California), Xerogel, Aerogel, amorphous fluorinated carbon, Parylene, BCB, SiLK (Dow Chemical, Midland, Michigan), polyimide, other low-k dielectric material, or combinations thereof. In the depicted embodiment, ILD layer 234 is a dielectric layer that includes a low-k dielectric material (generally referred to as a low-k dielectric layer). ILD layer 234 can include a multilayer structure having multiple dielectric materials. In some embodiments, a contact etch stop layer (CESL) is disposed between ILD layer 234 and second epitaxial layer 230 and between ILD layer 234 and gate spacers 214. The CESL includes a material different than ILD layer 234, such as a dielectric material that is different than the dielectric material of ILD layer 234. For example, where ILD layer 234 includes a low-k dielectric material, the CESL includes silicon and nitrogen, such as silicon nitride or silicon oxynitride. Subsequent to the deposition of ILD layer 234 and/or the CESL, a CMP process and/or other planarization process can be performed until reaching (exposing) a top portion (or top surface) of dummy gate stacks 214. In some embodiments, the planarization process removes hard mask layers to expose underlying dummy gate electrodes of dummy gate stacks 214, such as polysilicon gate electrode layers.

ILD layer 234 may be a portion of a multilayer interconnect (MLI) feature disposed over substrate 202. The MLI feature electrically couples various devices (for example, p-type GAA transistors and/or n-type GAA transistors of multigate device 200, transistors, resistors, capacitors, and/or inductors) and/or components (for example, gate structures and/or epitaxial source/drain features of multigate device 200), such that the various devices and/or components can operate as specified by design requirements of multigate device 200. The MLI feature includes a combination of dielectric layers and electrically conductive layers (e.g., metal layers) configured to form various interconnect structures. The conductive layers are configured to form vertical interconnect features, such as device-level contacts and/or vias, and/or horizontal interconnect features, such as conductive lines. Vertical interconnect features typically connect horizontal interconnect features in different layers (or different planes) of the MLI feature. During operation, the interconnect features are configured to route signals between the devices and/or the components of multigate device 200 and/or distribute signals (for example, clock signals, voltage signals, and/or ground signals) to the devices and/or the components of multigate device 200.

Continuing with FIG. 2F, dummy gate stacks 212 are removed to form gate trenches that expose semiconductor layer stacks 205A, 205B in channel regions C of multigate device 200. In some embodiments, an etching process completely removes dummy gate stacks 212 to expose semiconductor layers 206 and semiconductor layers 208 of semiconductor layer stacks 205A, 205B. The etching process is a dry etching process, a wet etching process, other suitable etching process, or combinations thereof. In some embodiments, the etching process is a multi-step etch process. For example, the etching process may alternate etchants to separately remove various layers of dummy gate stacks 212, such as the dummy gate electrode layers, the dummy gate dielectric layers, and/or the hard mask layers. In some embodiments, the etching process is configured to selectively etch dummy gate stacks 212 with minimal (to no) etching of other features of multigate device 200, such as ILD layer 234, gate spacers 214, semiconductor layers 206, and semiconductor layers 208. In some embodiments, a lithography process, such as those described herein, is performed to form a patterned mask layer that covers ILD layer 234 and/or gate spacers 214, and the etching process uses the patterned mask layer as an etch mask.

Continuing with FIG. 2F, semiconductor layers 206 exposed by the gate trenches are then selectively removed from the channel regions C of multigate device 200, thereby leaving suspended, channel layers 208'. In the depicted embodiment, removing semiconductor layers 206 provides three channel layers 208' through which current will flow between respective epitaxial source/drain features during operation of multigate device 200. In some embodiments, this process may be referred to as a channel nanowire release process, where each channel layer 208' has nanometer-sized dimensions and can be referred to as a nanowire. "Nanowire" generally refers to a channel layer suspended in a manner that will allow a metal gate to physically contact at least two sides of the channel layer, and in GAA transistors, will allow the metal gate to physically contact at least four sides of the channel layer (i.e., surround the channel layer). In such embodiments, a vertical stack of suspended channel layers can be referred to as a nanostructure. In some embodiments, after removing semiconductor layers 206, an etching process is performed to modify a profile of channel layers 208' to achieve desired dimensions and/or desired shapes (e.g., cylindrical-shaped (e.g., nanowire), rectangular-shaped (e.g., nanobar), sheet-shaped (e.g., nanosheet), etc.). The present disclosure further contemplates embodiments where the channel layers 208' (nanowires) have sub-nanometer dimensions depending on design requirements of multigate device 200.

In some embodiments, an etching process selectively etches semiconductor layers 206 with minimal (to no) etching of semiconductor layers 208 and, in some embodiments, minimal (to no) etching of gate spacers 214 and/or inner spacers 216. Various etching parameters can be tuned to achieve selective etching of semiconductor layers 206, such as etchant composition, etching temperature, etching solution concentration, etching time, etching pressure, source power, RF bias voltage, RF bias power, etchant flow rate, other suitable etching parameters, or combinations thereof. For example, an etchant is selected for the etching process that etches the material of semiconductor layers 206 (e.g., silicon germanium) at a higher rate than the material of semiconductor layers 208 (e.g., silicon) (i.e., the etchant has a high etch selectivity with respect to the material of semiconductor layers 206). The etching process is a dry etching process, a wet etching process, other suitable etching process, or combinations thereof. In some embodiments, a dry etching process (such as an RIE process) utilizes a fluorine-containing gas (for example, $SF_6$) to selectively etch semiconductor layers 206. In some embodiments, a ratio of the fluorine-containing gas to an oxygen-containing gas (for example, $O_2$), an etching temperature, and/or an RF power may be tuned to selectively etch silicon germanium or silicon. In some embodiments, a wet etching process utilizes an etching solution that includes ammonium hydroxide ($NH_4OH$) and water ($H_2O$) to selectively etch semiconductor layers 206. In some embodiments, a chemical vapor phase etching process using hydrochloric acid (HCl) selectively etches semiconductor layers 206.

Metal gate stacks, which include a gate dielectric 236 (for example, a gate dielectric layer) and a gate electrode 238 (for example, a work function layer and a bulk conductive layer), are then formed in the gate trenches. In FIG. 2F, metal gate stacks wrap (surround) channel layers 208', where gate dielectric 236 is disposed between gate electrode 238 and channel layers 208'. Metal gate stacks may include numerous other layers, for example, capping layers, interface layers, diffusion layers, barrier layers, hard mask layers, or combinations thereof. In the depicted embodiment, gate dielectric 236 includes a high-k dielectric layer, which includes a high-k dielectric material, such as $HfO_2$, HfSiO, $HfSiO_4$, HfSiON, HfLaO, HMO, HfTiO, HfZrO, $HfAlO_x$, ZrO, $ZrO_2$, $ZrSiO_2$, AlO, AlSiO, $Al_2O_3$, TiO, $TiO_2$, LaO, LaSiO, $Ta_2O_3$, $Ta_2O_5$, $Y_2O_3$, $SrTiO_3$, BaZrO, $BaTiO_3$ (BTO), $(Ba,Sr)TiO_3$ (BST), $Si_3N_4$, hafnium dioxide-alumina ($HfO_2$—$Al_2O_3$) alloy, other suitable high-k dielectric material, or combinations thereof. High-k dielectric material generally refers to dielectric materials having a high dielectric constant, for example, greater than that of silicon oxide ($k \approx 3.9$). The high-k dielectric layer is formed by any of the processes described herein, such as ALD, CVD, PVD, oxidation-based deposition process, other suitable process, or combinations thereof. In some embodiments, gate dielectric 236 includes an interfacial layer disposed between the high-k dielectric layer and channel layers 208'.

Gate electrode 238 includes a conductive material, such as polysilicon, Al, Cu, Ti, Ta, W, Mo, Co, TaN, NiSi, CoSi, TiN, WN, TiAl, TiAlN, TaCN, TaC, TaSiN, other conductive material, or combinations thereof. In some embodiments, the work function layer is a conductive layer tuned to have a desired work function (e.g., an n-type work function or a p-type work function), and the conductive bulk layer is a conductive layer formed over the work function layer. In some embodiments, the work function layer is an n-type work function layer and includes any suitable work function material, such as Ti, Al, Ag, Mn, Zr, TiAl, TiAlC, TiAlSiC, TaC, TaCN, TaSiN, TaAl, TaAlC, TaSiAlC, TiAlN, other n-type work function material, or combinations thereof. In some embodiments, the work function layer includes a p-type work function material such as Ru, Mo, Al, TiN, TaN, WN, $ZrSi_2$, $MoSi_2$, $TaSi_2$, $NiSi_2$, WN, other suitable p-type work function materials, or combinations thereof. The bulk (or fill) conductive layer includes a suitable conductive material, such as Al, W, and/or Cu. The bulk conductive layer may additionally or collectively include polysilicon, Ti, Ta, metal alloys, other suitable materials, or combinations thereof. The work function layer and/or the conductive bulk layer are formed by any of the processes described herein, such as ALD, CVD, PVD, plating, other deposition process, or combinations thereof.

Figure 2G:
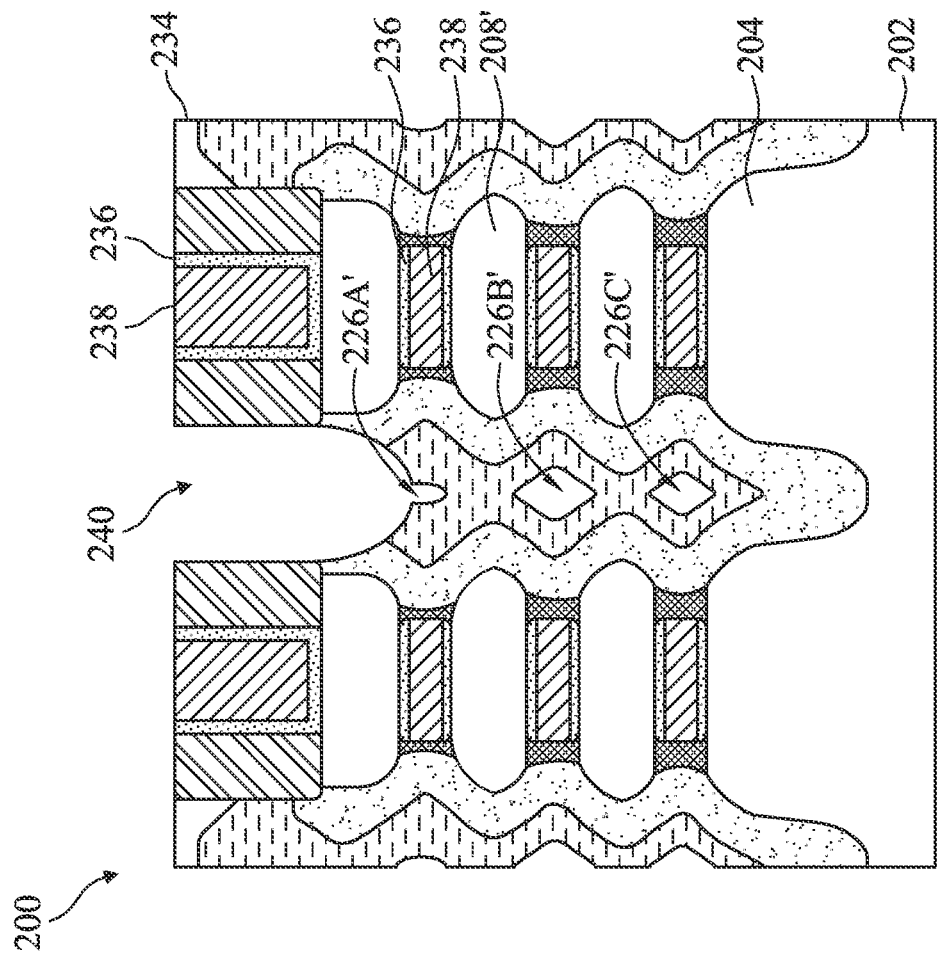

Turning to FIG. 2G, a source/drain contact opening 240 is formed that exposes one of epitaxial source/drain features 232. For example, an etching process removes a portion of ILD layer 234 to expose epitaxial source/drain feature 232 disposed between gate structure 210A and gate structure 210B. The etching process also partially etches epitaxial source/drain feature 232 (for example, second epitaxial layer 230 and first epitaxial layer 220) until reaching first void 226A'. In the depicted embodiment, the etching process is tuned to etch second epitaxial layer 230 and first epitaxial layer 220 to expose void 226A' without exposing void 226B' or void 226C'. In some embodiments, the etching process is tuned to etch second epitaxial layer 230 and/or first epitaxial layer 220 to expose void 226B' or void 226C'. The etching process may be one of the etch processes discussed above or any other suitable etch process. The etching process may be performed as a single step or may be performed as multiple steps to etch ILD layer 234, second epitaxial layer 230, and first epitaxial layer 220 individually. The etching process is tuned to remove each of ILD layer 234, second epitaxial layer 230, and first epitaxial layer 220 with minimal (to no) etching of gate spacers 214, gate dielectrics 236, and gate electrodes 238. In some embodiments, first epitaxial layer 220 has a first etch rate to an etchant and second epitaxial layer 230 has a second etch rate to the etchant, where the first etch rate is less than the second etch rate. In other embodiments, the first etch rate is the same or greater than the second etch rate.

Figure 2H:
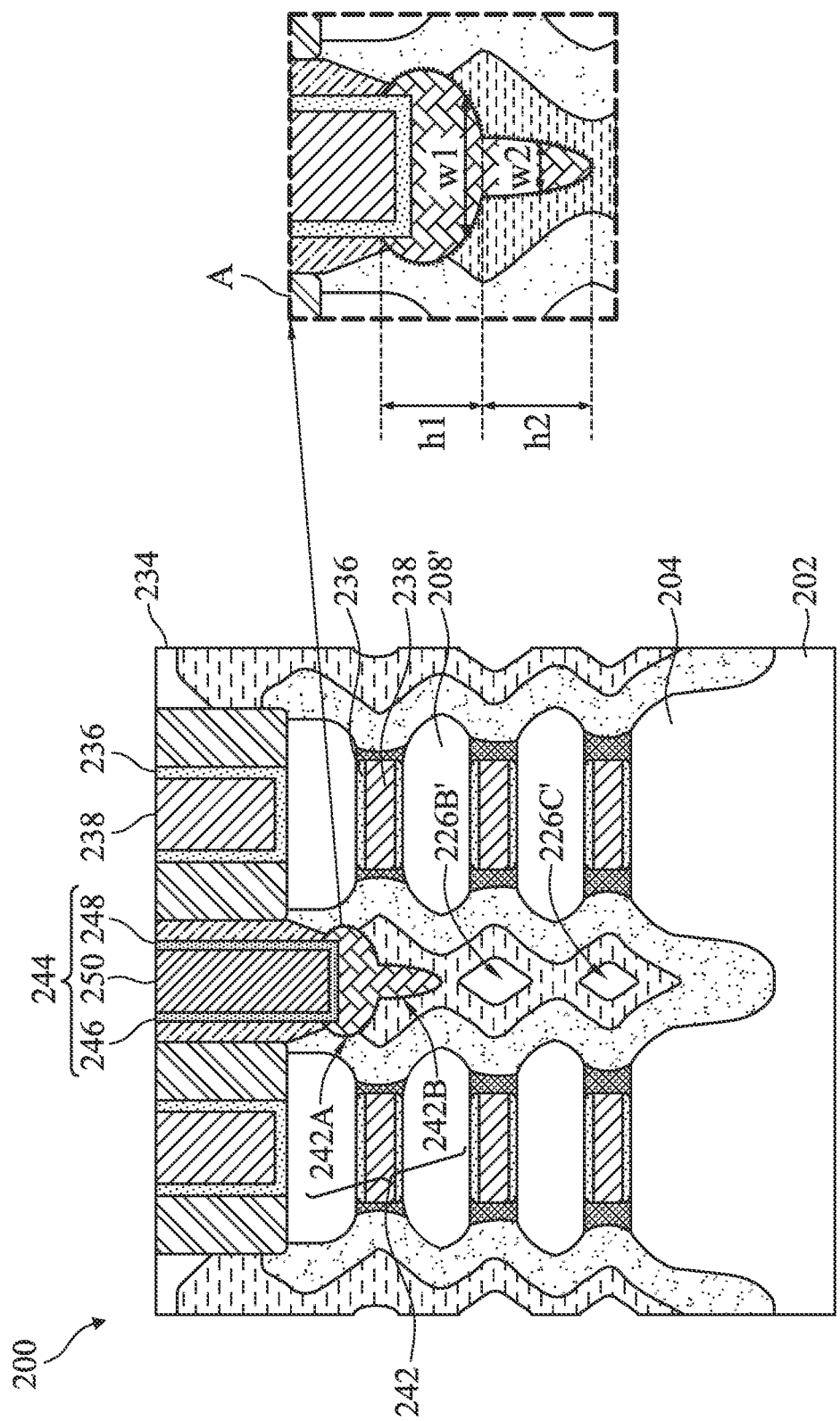

Turning to FIG. 2H, a silicide 242 is formed in the source/drain contact opening 240 and over epitaxial source/drain feature 232. Silicide 242 fills void 226A'. Silicide 242 includes a silicide top portion 242A and a silicide extension 242B. Silicide top portion 242A is formed between the topmost channel layers 208'. First epitaxial layer 220 is disposed along an upper portion of silicide top portion 242A and second epitaxial layer 230 is disposed along a lower portion of silicide top portion 242A. Silicide extension 242B is formed below silicide top portion 242A and between the inner spacers 216. In the depicted embodiment, silicide extension 242B further extends between middle channel layers 208'. In some embodiments, a top surface of silicide 242 is lower than a bottom surface of gate spacers 214 and a top surface of the top channel layers 208'. In some embodiments, the top surface of silicide 242 is above the top surface of the top channel layers 208'. Referring to an enlarged portion A of silicide 242, silicide top portion 242A has a width w1 and a height h1 and silicide extension portion has a width w2 and a height h2. In the depicted embodiment, width w1 is greater than width w2. In some embodiments, width w1 is about 1 nm to about 20 nm, and width w2 is about 1 nm to about 10 nm. In some embodiments, height h1 is about 1 nm to about 10 nm, and height h2 is about 1 nm to about 20 nm. In some embodiments, a sum of height h1 and height h2 is greater than at least a sum of a thickness of one of channel layers 208' and one of inner spacers 216.

Silicide 242 may be formed by depositing a metal layer over first and second epitaxial layers 220, 230 and heating multigate device 200 (for example, subjecting multigate device 200 to an annealing process) to cause constituents of first epitaxial layer 220 and/or second epitaxial layer 230 (for example, silicon and/or germanium) to react with metal constituents of the metal layer. The metal layer includes any metal constituent suitable for promoting silicide formation, such as nickel, platinum, palladium, vanadium, titanium, cobalt, tantalum, ytterbium, zirconium, other suitable metal, or combinations thereof. Silicide 242 thus includes a metal constituent and a constituent of first epitaxial layer 220 and/or second epitaxial layer 230, such as silicon and/or germanium. In some embodiments, silicide 242 includes nickel silicide, titanium silicide, or cobalt silicide. Any un-reacted metal, such as remaining portions of the metal layer, may be selectively removed relative to silicide 242 and/or a dielectric material, for example, by an etching process.

Continuing with FIG. 2H, a source/drain contact 244 is then formed on silicide 242 and fills a remainder of source/drain contact opening 240. Source/drain contact 244 includes a contact isolation layer 246, a contact barrier layer 248, and a contact bulk layer 286. In some embodiments, contact isolation layer 246 is formed on silicide 242 and on sidewalls of gate spacers 214. In some embodiments, where source/drain contact opening 240 does not expose gate spacers 214, ILD layer 234 is disposed between source/drain contact 244 (here, in particular, contact isolation layer 246) and gate spacers 214. In the depicted embodiment, contact isolation layer 246 is also disposed on exposed first epitaxial layer 220. Contact barrier layer 248 is formed on silicide 242 and on contact isolation layer 246. Contact bulk layer 250 is formed on contact barrier layer 248. In the depicted embodiment, silicide 242 is disposed along a bottom of contact barrier layer 248 and sidewalls of contact barrier layer, such that silicide 242 is disposed between sidewalls of contact barrier layer 282 and epitaxial source/drain feature 232 (in particular, first epitaxial layer 220). In some embodiments, width w1 of silicide top portion 242A is greater than a width of a conductive portion of source/drain contact 240 (in particular, a sum of a width of contact bulk layer 250 and a thickness of contact barrier layer 282). In some embodiments, source/drain contact 244 is formed by performing a first deposition process to form a contact isolation material over second epitaxial layer 230 and on sidewalls of gate spacers 214, where the contact isolation material partially fills source/drain contact opening 240; performing a second deposition process to form a contact barrier material over the contact isolation material, where the contact barrier material partially fills source/drain contact opening 240; and performing a third deposition process to form a contact bulk material over the contact barrier material, where the contact bulk material fills a remainder of source/drain contact opening 240. In such embodiments, contact barrier material and contact bulk material are disposed in source/drain contact opening 240 and over the top surface of silicide 242. The first deposition process, the second deposition process, and the third deposition process can include CVD, PVD, ALD, HDPCVD, MOCVD, RPCVD, PECVD, LPCVD, ALCVD, APCVD, PEALD, electroplating, electroless plating, other suitable deposition methods, or combinations thereof. In some embodiments, contact barrier layer 248 has a substantially uniform thickness along sidewalls of contact isolation layer 246 and along the top of silicide 242. Contact barrier layer 248 may thus be formed by a conformal deposition process. A CMP process and/or other planarization process is performed to remove excess contact bulk material, contact barrier material, and/or contact isolation material, for example, from over the top surface of ILD layer 234 and gate structures 210A, 210B, resulting in source/drain contact 244 (in other words, contact isolation layer 246, contact barrier layer 248, and contact bulk layer 250 filling source/drain contact opening 240).

Contact barrier layer 248 includes a material that promotes adhesion between a surrounding dielectric material (here, contact isolation layer 246) and contact bulk layer 250. The material of contact barrier layer 248 may further prevent diffusion of metal constituents (for example, metal atoms/ions) from source/drain contact 244 into the surrounding dielectric material. In some embodiments, contact barrier layer 248 includes titanium, titanium alloy, tantalum, tantalum alloy, cobalt, cobalt alloy, ruthenium, ruthenium alloy, molybdenum, molybdenum alloy, palladium, palladium alloy, other suitable constituent configured to promote and/or enhance adhesion between a metal material and a dielectric material and/or prevent diffusion of metal constituents from the metal material to the dielectric material, or combinations thereof. For example, contact barrier layer 248 includes tantalum, tantalum nitride, tantalum aluminum nitride, tantalum silicon nitride, tantalum carbide, titanium, titanium nitride, titanium silicon nitride, titanium aluminum nitride, titanium carbide, tungsten, tungsten nitride, tungsten carbide, molybdenum nitride, cobalt, cobalt nitride, ruthenium, palladium, or combinations thereof. In some embodiments, contact barrier layer 248 includes multiple layers. For example, contact barrier layer 248 may include a first sub-layer that includes titanium and a second sub-layer that includes titanium nitride. In another example, contact barrier layer 248 may include a first sub-layer that includes tantalum and a second sub-layer that includes tantalum nitride. Contact bulk layer 250 includes tungsten, ruthenium, cobalt, copper, aluminum, iridium, palladium, platinum, nickel, low resistivity metal constituent, alloys thereof, or combinations thereof. In the depicted embodiment, contact bulk layer 250 includes tungsten, ruthenium, and/or cobalt. In some embodiments, source/drain contact 244 does not include contact barrier layer 248 (i.e., source/drain contact 244 is a barrier-free contact), such that contact bulk layer 250 physically contacts silicide 242, contact isolation layer 246, and/or epitaxial source/drain feature 232 (in particular, second epitaxial layer 230). In some embodiments, source/drain contact 244 is partially barrier-free, where contact barrier layer 248 is disposed between contact isolation layer 246 and a portion of contact bulk layer 250. In some embodiments, contact bulk layer 250 includes multiple layers.

Gate all around (GAA) devices are becoming more popular. In GAA devices, the channel layers have limited current conducting capability. This leads to adding more horizontal stacked channel layers to improve conductivity. In conventional GAA device source/drain and contact formation techniques, the silicide is typically disposed between only the topmost channel layer. As GAA devices incorporate more channel layers, the lower channel layers (for example, a middle channel layer and a bottom channel layer in a three channel GAA device) suffer from poor current to voltage potential drop due to the long conduction paths. Additionally, the lower channel layers (e.g. middle channel layer and bottom channel layer) suffer from poor fringing capacitances. Traditional solutions to these problems have included forming thicker inner spacer layers to prohibit the source/drain encroachment. However, thicker inner spacer layers require stronger etching processes which cause punch-through leakage as the source/drain is etched deeper. By contrast, the proposed source/drain and contact formation techniques do not require stronger etching processes and therefore avoid the problem of punch-through leakage. Furthermore, the proposed source/drain and contact formation techniques allow for the formation of larger silicide features. The larger silicide extends beyond the top channel layer providing an increased contact landing area. The increased contact landing area reduces the parasitic resistance between contact and epitaxial source/drain features. Another advantage of some embodiments of the proposed techniques is the formation of voids in the epitaxial source/drain feature. The presence of at least one void in the epitaxial source/drain feature reduces parasitic capacitances.

FIGS. 3A-3I are diagrammatic cross-sectional views of a multigate device 300 at various stages of fabrication (such as those associated with method 100 in FIG. 1) according to various aspects of the present disclosure. Multigate device 300 may be included in a microprocessor, a memory, and/or other IC device. In some embodiments, multigate device 300 is a portion of an IC chip, a system on chip (SoC), or portion thereof, that includes various passive and active microelectronic devices such as resistors, capacitors, inductors, diodes, p-type field effect transistors (PFETs), n-type field effect transistors (NFETs), metal-oxide semiconductor field effect transistors (MOSFETs), complementary metal-oxide semiconductor (CMOS) transistors, bipolar junction transistors (BJTs), laterally diffused MOS (LDMOS) transistors, high voltage transistors, high frequency transistors, other suitable components, or combinations thereof. In some embodiments, multigate device 300 is included in a non-volatile memory, such as a non-volatile random access memory (NVRAM), a flash memory, an electrically erasable programmable read only memory (EEPROM), an electrically programmable read-only memory (EPROM), other suitable memory type, or combinations thereof. FIGS. 3A-3I have been simplified for the sake of clarity to better understand the inventive concepts of the present disclosure. Additional features can be added in multigate device 300, and some of the features described below can be replaced, modified, or eliminated in other embodiments of multigate device 300.

Figure 3A:
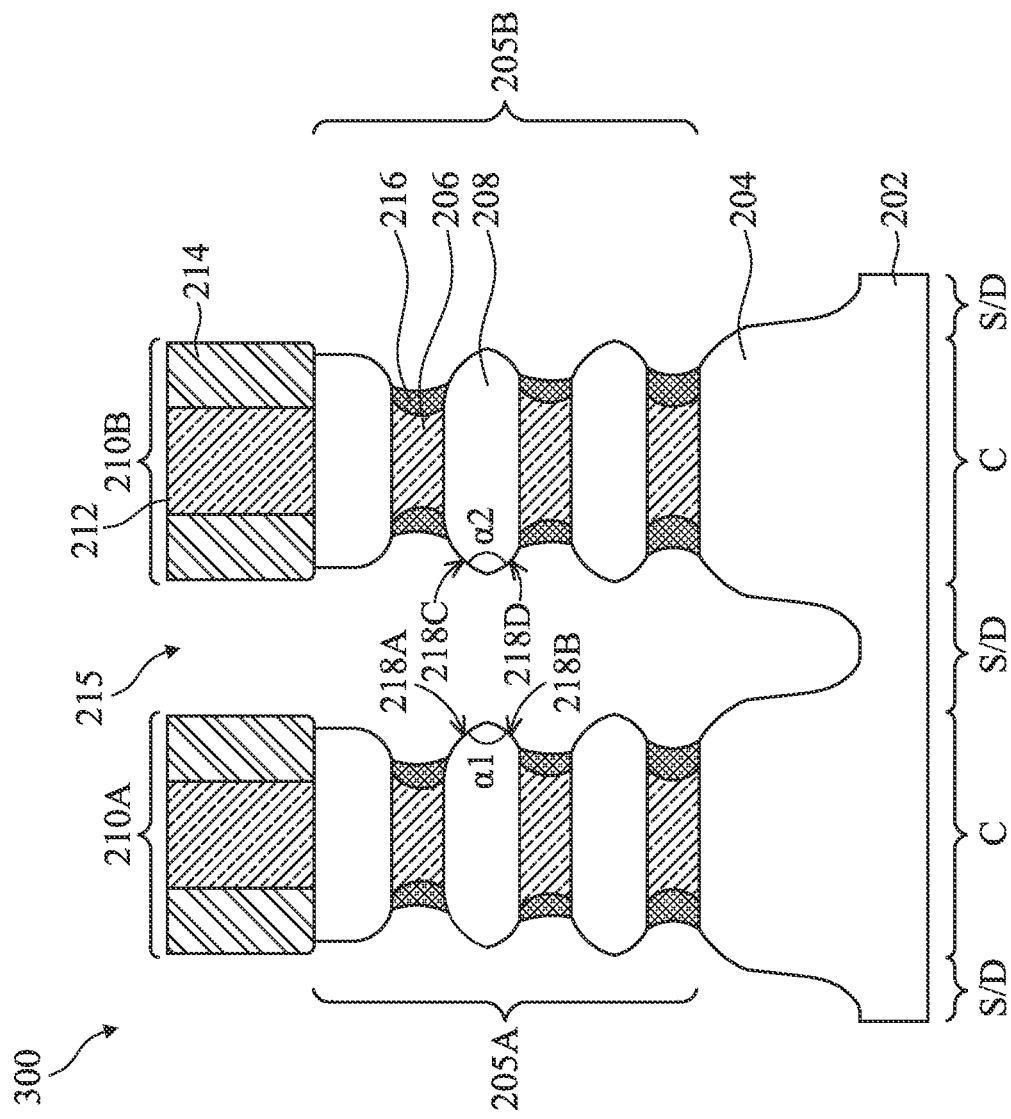
FIGS. 3A-3I are diagrammatic cross-sectional views of a multigate device at various fabrication stages (such as those associated with the method of FIG. 1) according to another embodiment of the present disclosure.

Multigate device 300 and its fabrication is similar to multigate device 200 and its fabrication in many respects. Accordingly, for clarity and simplicity, similar features in multigate device 200 in FIGS. 2A-2H and multigate device 300 in FIGS. 3A-3I are identified by the same reference numerals. Turning to FIG. 3A, multigate device 300 is initially formed in a similar manner as described above with respect to multigate device 200 illustrated in FIG. 2A. For example, in FIG. 3A, after a source/drain recess process and an inner spacer fabrication process, multigate device 300 includes substrate 202, semiconductor layer stack 205A disposed over a respective substrate extension 204, and semiconductor layer stack 205B disposed over a respective substrate extension 204. Semiconductor layer stacks 205A, 205B include semiconductor layers 206 and semiconductor layers 208 stacked vertically (e.g., along the z-direction) in an interleaving or alternating configuration from a surface of substrate 202. Gate structures 210A, 210B are disposed over semiconductor layer stacks 205A, 205B, respectively. Each of gate structures 210A, 210B includes a dummy gate stack 212 and gate spacers 214. Multigate device 300 further contains source/drain recesses 215 and inner spacers 216 disposed on semiconductor layers 206 in source/drain recesses 215.

Consistent with the processing of multigate device 200, after the inner spacer etch process performed on multigate device 300, semiconductor layers 208 of semiconductor layer stack 205A have facets 218A and facets 218B, and semiconductor layers 208 of semiconductor layer stack 205B have facets 218C and 218D. Each of facets 218A-218D have a (111) crystallographic orientation, which facilitates subsequent growth of epitaxial source/drain features in a manner as described herein. An angle $\alpha 1$ is between facets 218A and facets 218B, and an angle $\alpha 2$ is between facets 218C and facets 218D. In some embodiments, angle $\alpha 1$ and $\alpha 2$ are about 90° to about 130°.

Turning to FIGS. 3B-3F, processing proceeds with forming epitaxial source/drain features in source/drain recesses 215. As described below, the epitaxial source/drain features have characteristics to improve/enhance contact formation and improve formation of multigate device 300. For example, referring to FIGS. 3B-3D, first epitaxial layer 220 is formed in source/drain recesses 215. First epitaxial layer 220 partially fills source/drain recesses 215. For example, a semiconductor material is epitaxially grown from portions of substrate 202 and semiconductor layers 208 exposed by source/drain recesses 215, forming first epitaxial layer 220 in source/drain recesses 215. The epitaxy process is performed in a similar manner as described above with respect to multigate device 200 illustrated in FIG. 2B-2D.

Figure 3B:
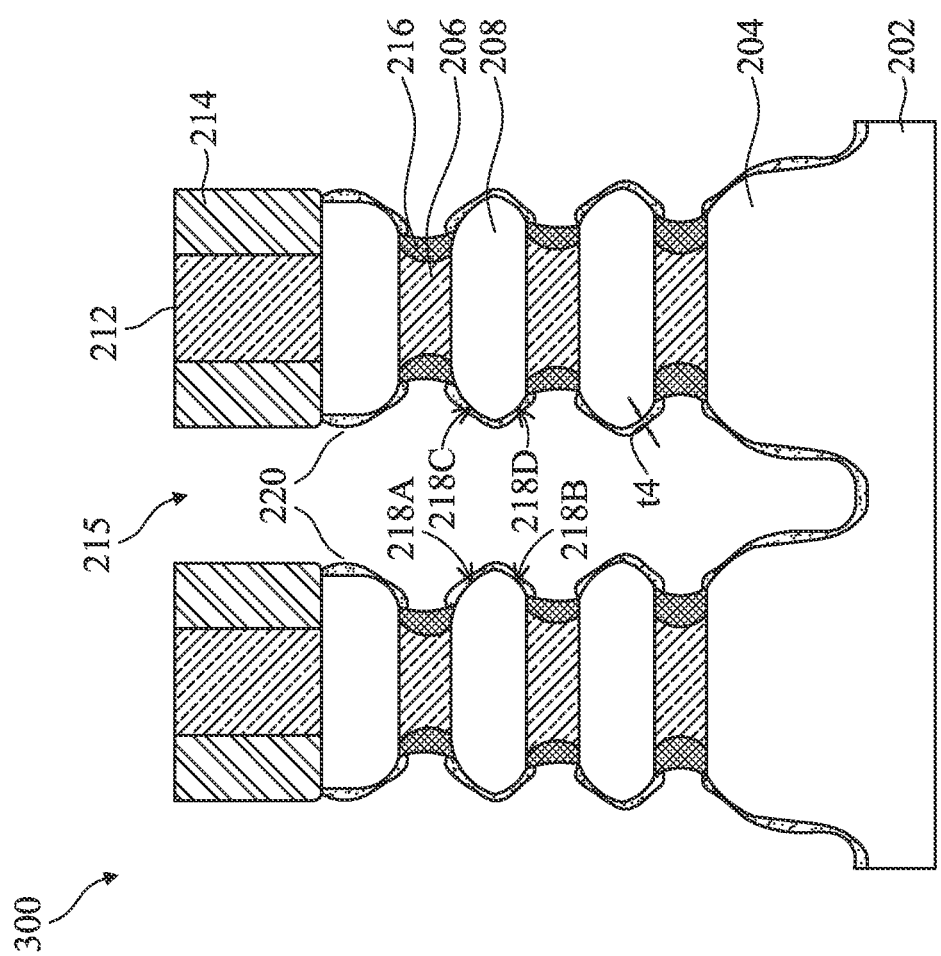

Turning to FIG. 3B, first epitaxial layer 220 is formed on semiconductor layers 208 (in particular, on (111) facets 218A-218D of semiconductor layers 208) and on substrate 202 in source/drain recesses 215. In some embodiments, the epitaxy process is performed until first epitaxial layer 220 covers exposed surfaces of semiconductor layers 208 and substrate 202 in source/drain recesses 215. In the depicted embodiment, first epitaxial layer 220 includes separate portions that are not connected (or merged) to one another. For example, since first epitaxial layer 220 is not formed on inner spacers 216, portions of first epitaxial layer 220 disposed on adjacent semiconductor layers 208 are not connected to one another and portions of first epitaxial layer 220 formed on substrate 202 are not connected to portions of first epitaxial layer 220 formed on semiconductor layers 208. In some embodiments, first epitaxial layer 220 has a thickness t4 on facets 218A-218D. In some embodiments, thickness t4 is less than thickness t1 of first epitaxial layer 220 of multigate device 200. The source/drain recesses 215 are now defined by first epitaxial layer 220 and inner spacers 216.

Figure 3C:
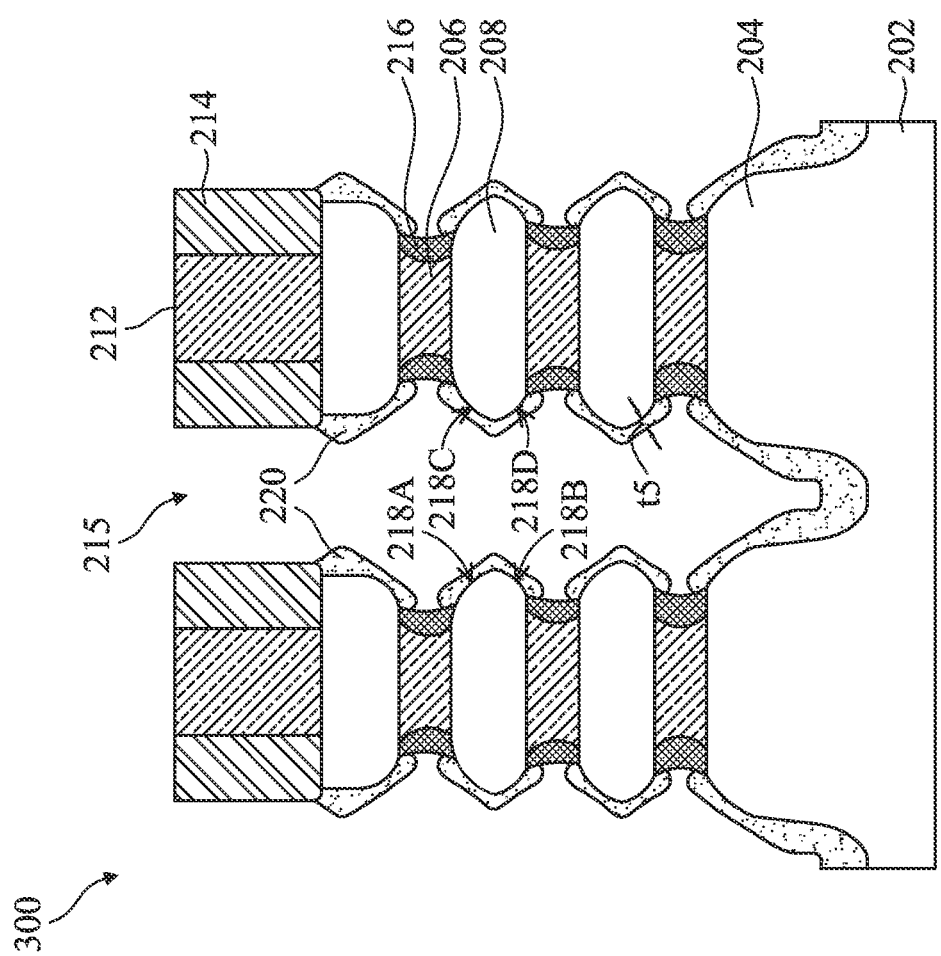

Turning to FIG. 3C, first epitaxial layer 220 formation continues in the source/drain recesses 215. In some embodiments, first epitaxial layer 220 is formed to a thickness t5 that is greater than thickness t4. In some embodiments, thickness t5 is less than thickness t2 of first epitaxial layer 220 of multigate device 200. In some embodiments, first epitaxial layer 220 is formed to thickness t5 as part of the same process used to form first epitaxial layer 220 to thickness t4. In some embodiments, first epitaxial layer 220 is formed to thickness t5 in a separate process than used to form first epitaxial layer 220 to thickness t4. In the depicted embodiment, the epitaxy process is performed until first epitaxial layer 220 covers a portion of inner spacers 216 with another portion of inner spacers 216 still exposed in source/drain recesses 215. In this embodiment, first epitaxial layer 220 includes separate portions that are not connected (or merged) to one another. The source/drain recesses 215 are now defined by first epitaxial layer 220 and the exposed portion of inner spacers 216.

Figure 3D:
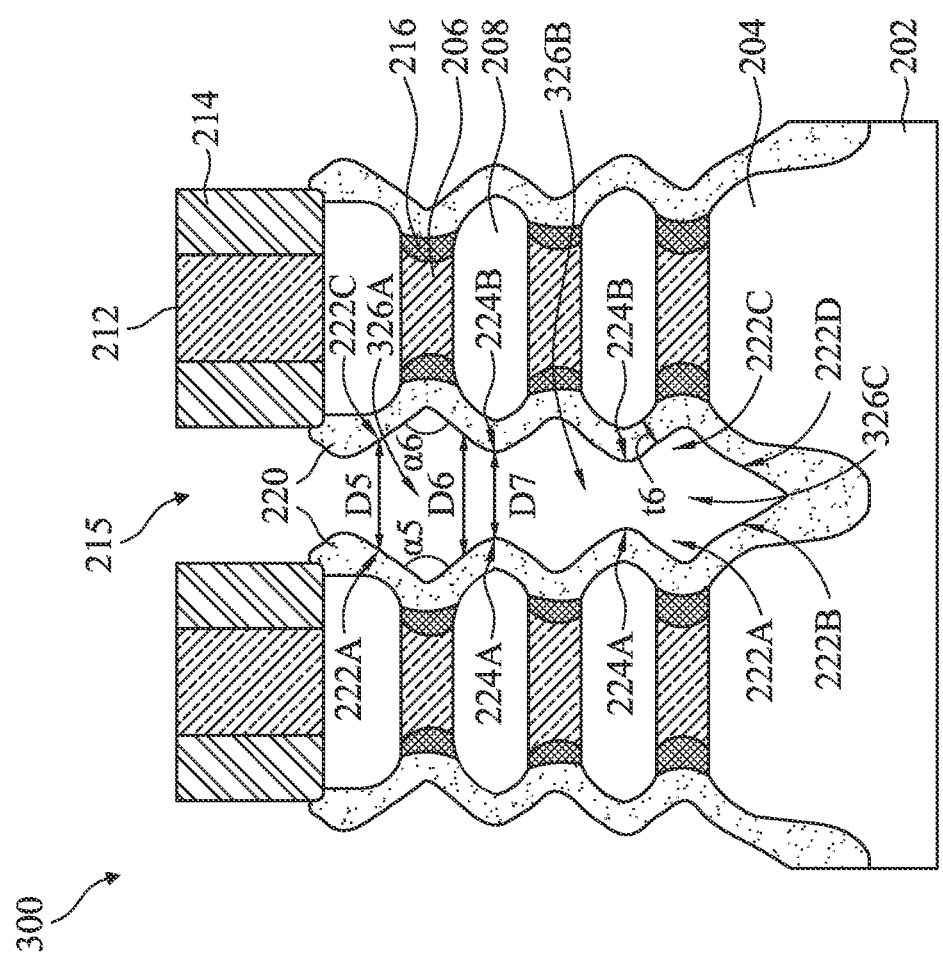

Turning to FIG. 3D, first epitaxial layer 220 formation continues in the source/drain recesses 215. In some embodiments, first epitaxial layer 220 has a thickness t6 that is greater than thickness t5. In some embodiments, thickness t6 is less than thickness t3 of first epitaxial layer 220 of multigate device 200. In some embodiments, thickness t6 is about 2 nm to about 10 nm. In some embodiments, first epitaxial layer may be formed to thickness t6 in the same process used to form first epitaxial layer 220 to thickness t5. In some embodiments, first epitaxial layer 220 may be formed to thickness t6 in a separate process than used to form first epitaxial layer 220 to thickness t5. First epitaxial layer 220 has facets 222A, facets 222B, facets 222C, facets 222D, facets 224A, and facets 224B. In the depicted embodiment, facets 222A-222D of first epitaxial layer 220 have a (111) crystallographic orientation and facets 224A, 224B of first epitaxial layer 220 have a (100) crystallographic orientation. Facets 222A and facets 222D extend along a first direction, and facets 222B and facets 222C extend along a second direction that is different that the first direction. In some embodiments, facets 222A and facets 222D are substantially parallel to one another, and facets 222B and facets 222C are substantially parallel to one another. Facets 222A and facets 222C are separated by a distance D5, and facets 222B and facets 222D are separated by a distance D6. Distance D5 increases along a direction perpendicular to a top surface of substrate 202 (for example, the z-direction). Distance D6 decreases along the direction perpendicular to the top surface of substrate 202. An angle α5 is between facets 222A and facets 222B, and an angle α6 is between facets 222C and 222D. In some embodiments, angle α5 and angle α6 are about 90° to about 130°. In the depicted embodiment, facets 222A-222D of first epitaxial layer 220 define a void portion 326A, a void portion 326B, and a void portion 326C of source/drain recesses 215. For example, each of void portions 326A-326C is defined by a respective one of facets 222A, a respective one of facets 222B, a respective one of facets 222C, and a respective one of facets 222D. In some embodiments, void portions 326A-326C have a diamond-like shape.

Facets 224A, 224B of first epitaxial layer 220 are disposed between facets 222A-222D and void portions 226A-226C. For example, facets 224A extend from facets 222B to facets 222A and facets 224B extend from facets 222D to facets 222C. Facets 224A and facets 224B are separated by a distance D7, which is less than distance D5 and distance D6. In the depicted embodiment, facets 222A-222D and facets 224A, 224B of first epitaxial layer 220 define three void portions 326A-326C of source/drain recesses 215, though the present disclosure contemplates embodiments where more or less void portions are defined by first epitaxial layer 220. The epitaxy process of first epitaxial layer 220 is tuned to ensure that distance D7 is sufficiently small compared to distance D6 and distance D5 to achieve merging of a subsequently formed epitaxial layer between facets 224A, 224B before filling void portions 326A-326C. For example, a growth rate and/or growth time of a first epitaxial material of first epitaxial layer 220 can be controlled to achieve desired distance D7, distance D5, and/or distance D6. In some embodiments, various parameters of the epitaxy process, such as time, temperature, and pressure may be tuned to achieve the desired distances D5, D6, and D7. Source/drain recesses 215 are now defined by first epitaxial layer 220.

Figure 3E:
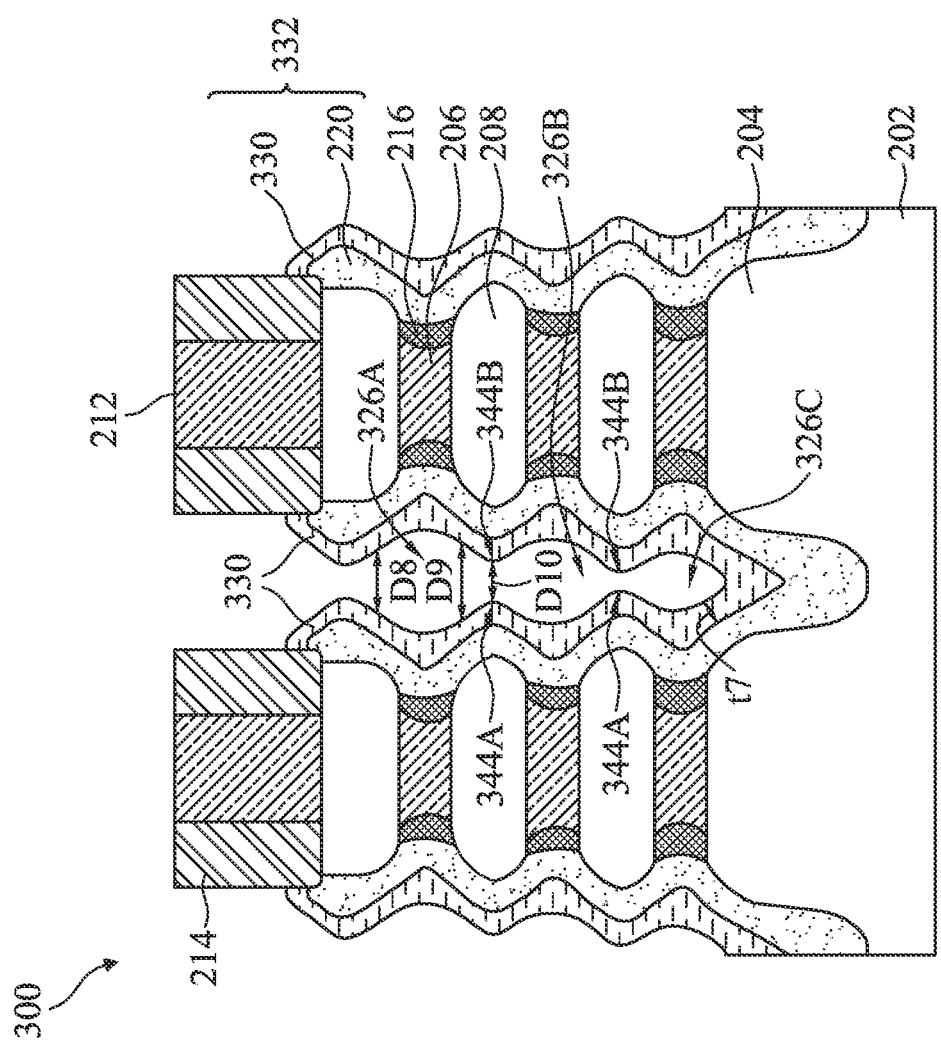

Turning to FIG. 3E, second epitaxial layer 330 is formed on first epitaxial layer 220 in source/drain recesses 215. In some embodiments, second epitaxial layer 330 includes separate portions that are not connected (or merged) to one another. In the depicted embodiment, the epitaxy process is performed until second epitaxial layer 330 merges into a continuous layer over first epitaxial layer 220 in source/drain recesses 215. The epitaxy process is performed in a similar manner as described above with respect to multigate device 200 illustrated in FIG. 2E.

Second epitaxial material 330 disposed over facets 222A and facets 222C are separated by a distance D8 that is less than distance D5 by about a thickness t7. Distance D8 increases along the direction perpendicular to the top surface of substrate 202. Second epitaxial material 330 disposed over facets 222B and facets 222D are separated by a distance D9 is less than distance D6 by about thickness t7. Distance D9 decreases along the direction perpendicular to the top surface of substrate 202. Second epitaxial layer 330 has facets 344A and facets 344B. In the depicted embodiment, facets 344A, 344B of second epitaxial layer 330 have a (110) crystallographic orientation. Facets 344A, 344B are disposed over facets 224A, 224B of first epitaxial layer 220 and between void portions 326A-326C. Facets 344A and facets 344B are separated by a distance D10 which is less than distance D7. The epitaxy process of second epitaxial layer 330 is tuned to ensure that distance D10 is sufficiently small compared to distance D8 and distance D9 to achieve merging of subsequently formed second epitaxial layer 330 before filling void portions 326A-326C. Source/drain recesses 215 are now defined by second epitaxial layer 330.

Figure 3F:
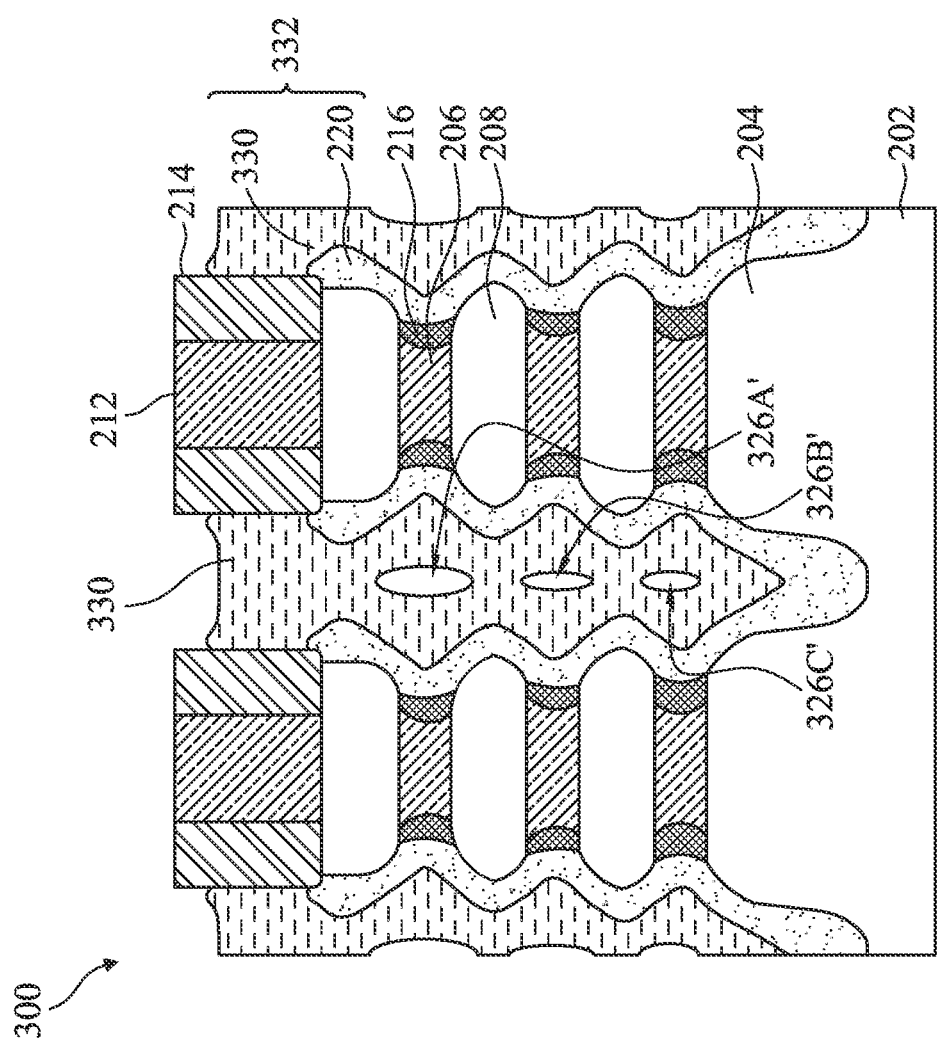

Turning to FIG. 3F, second epitaxial layer 330 formation continues in source/drain recesses 215 such that second epitaxial layer 330 merges between facets 344A and facets 344B before filling void portions 326A-326C. Second epitaxial layer 330 and first epitaxial layer 220 collectively form epitaxial source/drain features 332 of multigate device 300. In the depicted embodiment, second epitaxial layer 330 overfills source/drain recesses 215, such that a portion of second epitaxial layer 330 is disposed between gate structures 210A, 210B. In some embodiments, second epitaxial layer 330 is formed and merges, forming voids 326A'-326C', as part of a single process. In some embodiments, second epitaxial material 330 is formed and merges, forming voids 326A'-326C', in separate processes. Voids 326A'-326C' (also referred to as air gaps) are a remainder of void portions 326A-326C that are not filled by second epitaxial layer 330 and are separated by merged portions of second epitaxial layer 330. In the depicted embodiment, each of voids 326A'-326C' is defined between a respective pair of inner spacers 216 and semiconductor layers 206, while each of the merged portions of second epitaxial layer 330 is defined between a respective pair of semiconductor layers 208. Voids 326A'-326C' have any suitable shape depending on desired silicide formation, as described further below, and voids 326A'-326C' can have the same shape/profile or different shapes/profiles. In the depicted embodiment, voids 326A'-326C' are all oval shaped. In some embodiments, vertical spacing D11 between adjacent voids is less than about 5 nm.

As shown in the depicted embodiments, voids 326A'-326C' of multigate device 300 are different than voids 226A'-226C' of multigate device 200. The differences are due to process adjustments that may be made during the formation of multigate device 200 and/or multigate device 300. For example, first epitaxial layer 220 of multigate device 200 is formed to thickness t3, which is larger than thickness t6 of first epitaxial layer 220 of multigate device 300. The difference in thickness t3 and thickness t6 causes distances D1, D2, and D3 of multigate device 200 to be smaller than distances D5, D6, and D7 of multigate device 300. This difference in size allows for a different formation process of second epitaxial layer 230 of device 200 as compared to second epitaxial layer 330 of device 300. The different formation process may be used to adjust the sizes and shapes of voids 226A'-226C' of multigate device 200 and voids 326A'-326C' of multigate device 300. The difference in size between distances D1, D2, and D3 and distances D5, D6, and D7 further cause vertical spacing D4 to be larger than vertical spacing D11. Vertical spacing between voids 226A'-226C', 326A'-326C' affects the strength of the source/drain feature 232, 332 etch process required to expose voids 226A'-226C', 326A'-326C' and which of voids 226A'-226C', 326A'-326C' are exposed during the etch process, such as that used when forming source/drain contacts.

Figure 3G:
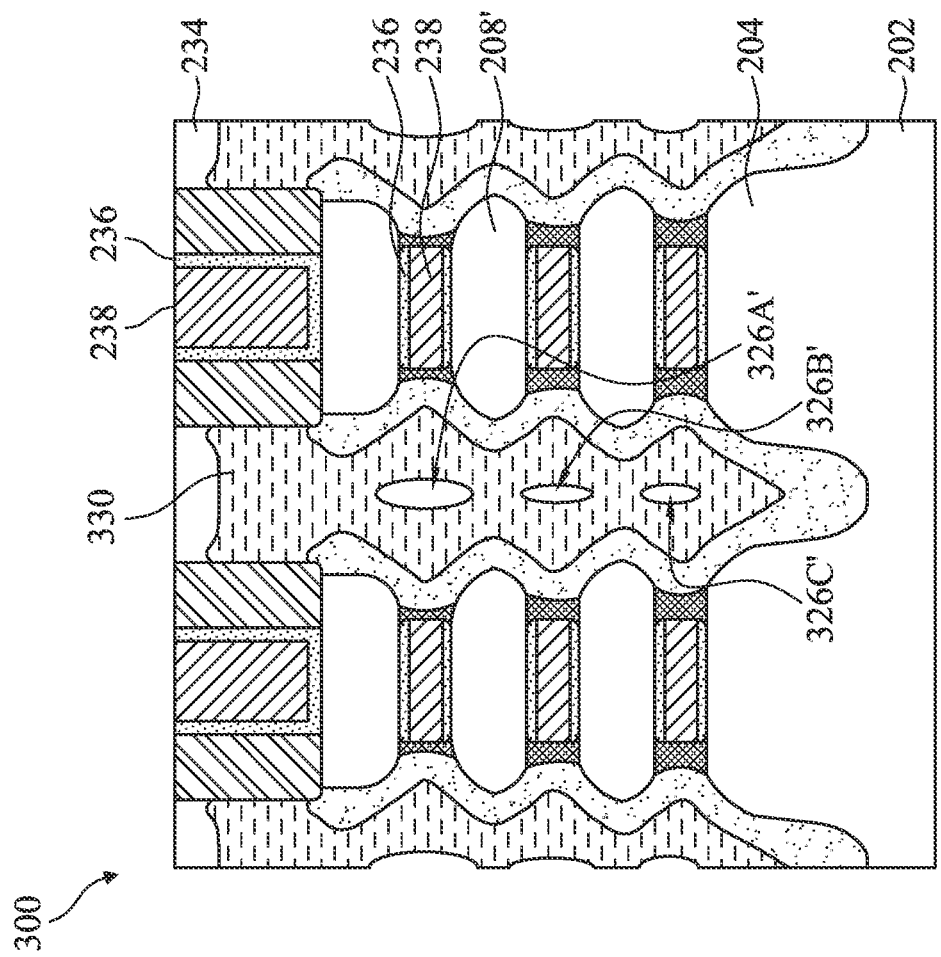

Turning to FIG. 3G, multigate device 300 is further formed in a similar manner as described above with respect to multigate device 200 illustrated in FIG. 2F. For example, ILD layer 234 is formed over epitaxial source/drain features 332 (in particular, second epitaxial layer 330), dummy gates 212, and gate spacers 214. Dummy gate stacks 212 are removed to form gate trenches that expose semiconductor layer stacks 2015A, 205B in channel regions C of multigate device 300. Semiconductor layers 206 exposed by the gate trenches are then selectively removed from the channel regions C of multigate device 300, thereby leaving suspended, channel layers 208'. In the depicted embodiment, removing semiconductor layers 206 provides three channel layers 208' through which current will flow between respective epitaxial source/drain features during operation of multigate device 300. In some embodiments, this process may be referred to as a channel nanowire release process, where each channel layer 208' has nanometer-sized dimensions and can be referred to as a nanowire, as described above. In some embodiments, after removing semiconductor layers 206, an etching process is performed to modify a profile of channel layers 208' to achieve desired dimensions and/or desired shapes (e.g., cylindrical-shaped (e.g., nanowire), rectangular-shaped (e.g., nanobar), sheet-shaped (e.g., nanosheet), etc.). The present disclosure further contemplates embodiments where the channel layers 208' (nanowires) have sub-nanometer dimensions depending on design requirements of multigate device 300. For example, an etching process as described above with respect to FIG. 2F is performed.

Metal gate stacks, which include gate dielectric 236 (for example, a gate dielectric layer) and gate electrode 238 (for example, a work function layer and a bulk conductive layer), are then formed in the gate trenches. In FIG. 3G, metal gate stacks wrap (surround) channel layers 208', where gate dielectric 236 is disposed between gate electrode 238 and channel layers 208'. Metal gate stacks may include numerous other layers as described above. In the depicted embodiment, gate dielectric 236 includes a high-k dielectric layer as described above. In some embodiments, gate dielectric 236 includes an interfacial layer disposed between the high-k dielectric layer and channel layers 208'. Gate electrode 238 includes a conductive material such as those described above.

Figure 3H:
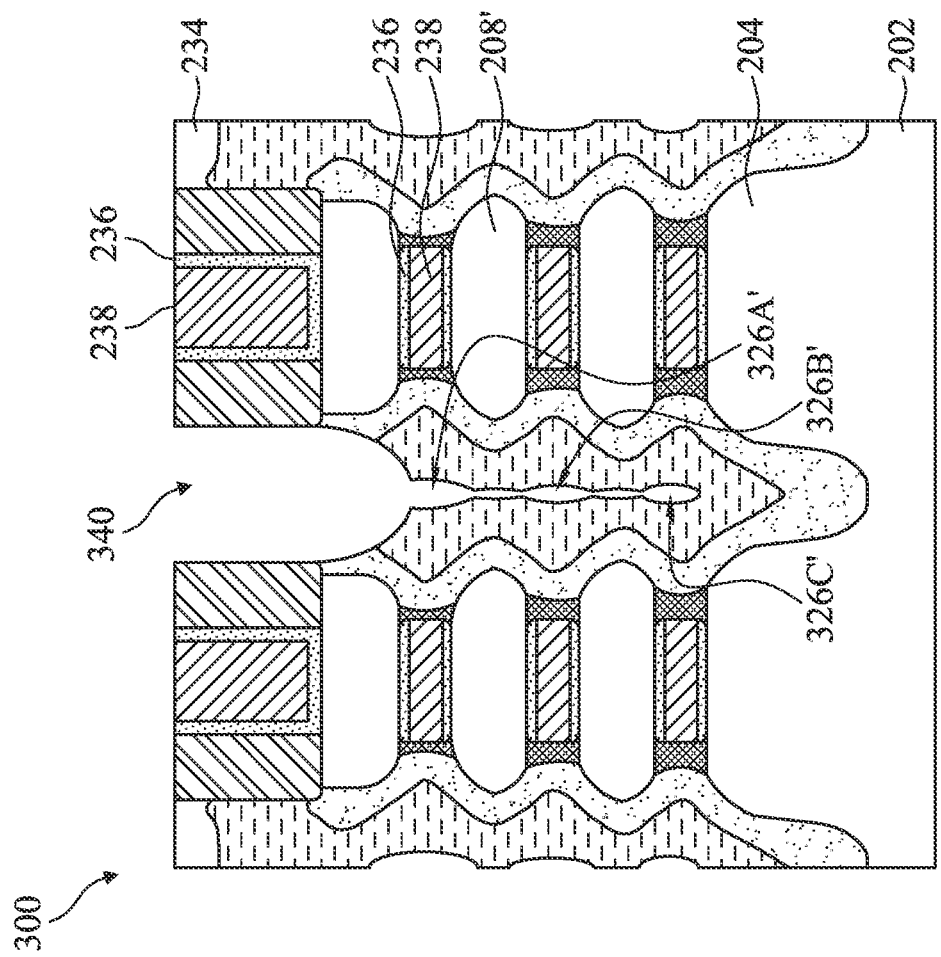

Turning to FIG. 3H, a source/drain contact opening 340 is formed that exposes one of epitaxial source/drain features 332. For example, an etching process removes a portion of ILD layer 234 to expose epitaxial source/drain feature 332 disposed between gate structure 210A and gate structure 210B. The etching process also partially etches epitaxial source/drain feature 332 (for example, second epitaxial layer 330 and first epitaxial layer 220) until reaching void 326A'. In the depicted embodiment, the etching process is tuned to etch second epitaxial layer 330 and first epitaxial layer 220 to expose voids 326A'-326C', resulting in a source/drain contact opening 340 extending into epitaxial source/drain features 332. For example, source/drain contact opening 340 extends to a depth of bottommost channel layers 208'. In some embodiments, the etching process is tuned to etch second epitaxial layer 330 and/or first epitaxial layer 220 to expose voids 326A', 326B' without exposing void 326C'. The etching process may be one of the etch processes discussed above or any other suitable etch process. The etching process may be performed as a single step or may be performed as multiple steps to etch ILD layer 234, second epitaxial layer 330, and first epitaxial layer 220 individually. The etching process is tuned to remove each of ILD layer 234, second epitaxial layer 330, and first epitaxial layer 220 with minimal (to no) etching of gate spacers 214, gate dielectrics 236, and gate electrodes 238. In some embodiments, first epitaxial layer 220 has a first etch rate to an etchant and second epitaxial layer 330 has a second etch rate to the etchant, where the first etch rate is less than the second etch rate. In other embodiments, the first etch rate is the same or greater than the second etch rate.

Figure 3I:
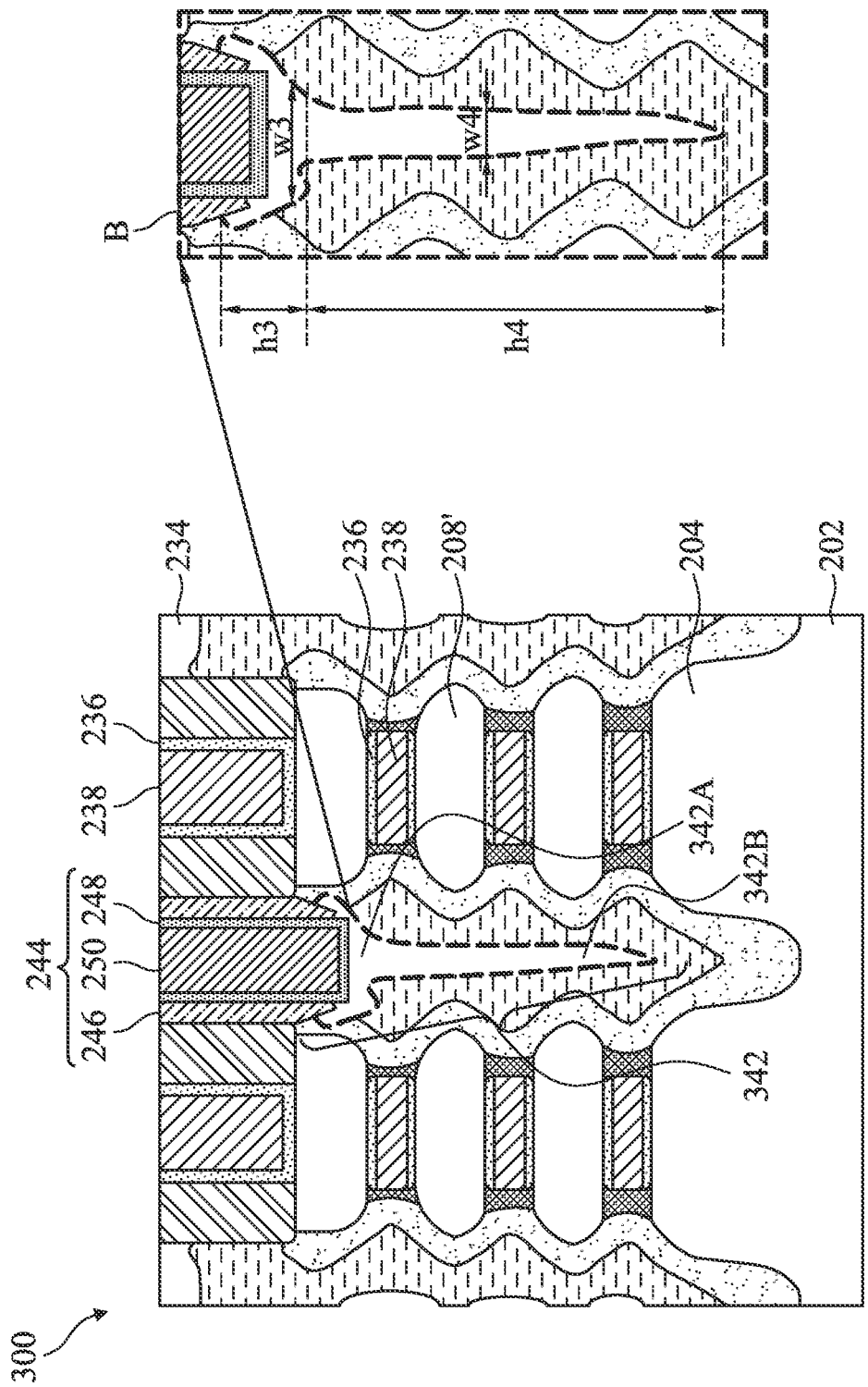

Turning to FIG. 3I, a silicide 342 is formed in the source/drain contact opening 340 and over epitaxial source/drain feature 332. Silicide 342 fills the extension of source/drain contact opening 340 into epitaxial source/drain feature 332 (here, formed by the combination of voids 326A'-326C'). Silicide 342 includes a silicide top portion 342A and a silicide extension 342B. Silicide top portion 342A is formed between the topmost channel layers 208'. First epitaxial layer 220 is disposed along an upper portion of silicide top portion 342A and second epitaxial layer 330 is disposed along a lower portion of silicide top portion 342A. Silicide extension 342B is formed below silicide top portion 342A and between the inner spacers 216. In the depicted embodiment, silicide extension 342B further extends between middle channel layers 208'. In some embodiments, a top surface of silicide 342 is lower than a bottom surface of gate spacers 214 and a top surface of the top channel layers 208'. In some embodiments, the top surface of silicide 342 is above the top surface of the top channel layers 208'. Referring to an enlarged portion B of silicide 342, silicide top portion 342A has a width w3 and a height h3 and silicide extension portion has a width w4 and a height h4. In the depicted embodiment, width w3 is greater than width w4. In some embodiments, width w3 is about 1 nm to about 20 nm, and width w4 is about 1 nm to about 20 nm. In some embodiments, height h3 is about 1 nm to about 20 nm, and height h4 is about 1 nm to about 70 nm. In some embodiments, a sum of height h3 and height h4 is greater than at least a sum of a thickness of two of channel layers 208' and two of inner spacers 216. Silicide 342 is formed in a similar manner as described above with respect to multigate device 200 illustrated in FIG. 2H.

Source/drain contact 244 is then formed on silicide 342 and fills a remainder of source/drain contact opening 340. Source/drain contact 244 is formed in a similar manner as described above with respect to multigate device 200 illustrated in FIG. 2H. For example, source/drain contact 244 includes contact isolation layer 246, contact barrier layer 248, and contact bulk layer 286. In some embodiments, contact isolation layer 246 is formed on silicide 242 and on sidewalls of gate spacers 214. In some embodiments, where source/drain contact opening 340 does not expose gate spacers 214, ILD layer 234 is disposed between source/drain contact 244 (here, in particular, contact isolation layer 246) and gate spacers 214. In the depicted embodiment, contact isolation layer 246 is also disposed on exposed first epitaxial layer 220. Contact barrier layer 248 is formed on silicide 342 and on contact isolation layer 246. Contact bulk layer 250 is formed on contact barrier layer 248. In the depicted embodiment, silicide 342 is disposed along a bottom of contact barrier layer 248 and sidewalls of contact barrier layer, such that silicide 342 is disposed between sidewalls of contact barrier layer 282 and epitaxial source/drain feature 332 (in particular, first epitaxial layer 220). In some embodiments, width w3 of silicide top portion 342A is greater than a width of a conductive portion of source/drain contact 340 (in particular, a sum of a width of contact bulk layer 250 and a thickness of contact barrier layer 282). In some embodiments, source/drain contact 244 is formed by performing a first deposition process to form a contact isolation material over second epitaxial layer 330 and on sidewalls of gate spacers 214, where the contact isolation material partially fills source/drain contact opening 340; performing a second deposition process to form a contact barrier material over the contact isolation material, where the contact barrier material partially fills source/drain contact opening 340; and performing a third deposition process to form a contact bulk material over the contact barrier material, where the contact bulk material fills a remainder of source/drain contact opening 340. In such embodiments, contact barrier material and contact bulk material are disposed in source/drain contact opening 340 and over the top surface of silicide 342. The first deposition process, the second deposition process, and the third deposition process can include CVD, PVD, ALD, HDPCVD, MOCVD, RPCVD, PECVD, LPCVD, ALCVD, APCVD, PEALD, electroplating, electroless plating, other suitable deposition methods, or combinations thereof. In some embodiments, contact barrier layer 248 has a substantially uniform thickness along sidewalls of contact isolation layer 246 and along the top of silicide 242. Contact barrier layer 248 may thus be formed by a conformal deposition process. A CMP process and/or other planarization process is performed to remove excess contact bulk material, contact barrier material, and/or contact isolation material, for example, from over the top surface of ILD layer 234 and gate structures 210A, 210B, resulting in source/drain contact 244 (in other words, contact isolation layer 246, contact barrier layer 248, and contact bulk layer 250 filling source/drain contact opening 340).

The present disclosure provides for many different embodiments. An exemplary device includes a first channel layer disposed over a substrate and a second channel layer disposed over the first channel layer. A gate stack surrounds the first channel layer and the second channel layer. A source/drain features is disposed adjacent to the first channel layer, the second channel layer, and the gate stack. The source/drain feature is disposed over first facets of the first channel layer and second facets of the second channel layer. The first facets and the second facets have a (111) crystallographic orientation. The device further includes inner spacers disposed between the gate stack and the source/drain feature and further disposed between the first channel layer and the second channel layer. A silicide feature is disposed over the source/drain feature. The silicide feature extends into the source/drain feature towards the substrate to a depth of the first channel layer. In some embodiments, the depth is greater than a depth of a top surface of the first channel layer. In some embodiments, the silicide feature comprises an upper portion and a lower portion where a width of the upper portion is greater than a width of the lower portion. In some embodiments, the lower portion of the silicide feature extends to the depth where the depth is greater than a depth of a bottom surface of the first channel layer. The device further includes a source/drain contact disposed over the silicide feature.

In some embodiments, the source/drain feature includes a first semiconductor layer and a second semiconductor layer where the first semiconductor layer is disposed over the first facets of the first channel layer, the second facets of the second channel layer, and the inner spacer and where the second semiconductor layer is disposed over the first semiconductor layer. In some embodiments, the first semiconductor layer has third facets and fourth facets where the third facets have a (111) crystallographic orientation and the fourth facets have a (110) crystallographic orientation. In some embodiments, a void is disposed within the source/drain feature, the void being disposed between a set of the (111) facets of the first channel layer and the (111) facets of the second channel layer.

An exemplary method forming a source/drain recess adjacent to a semiconductor layer stack disposed over a substrate. The semiconductor layer stack includes a first semiconductor layer disposed between a second semiconductor layer and a third semiconductor layer. The method further includes performing a deposition process and an etching process to form an inner spacer adjacent to the first semiconductor layer. The etching process is tuned to form first facets of the second semiconductor layer and second facets of the third semiconductor layer where the first facets and the second facets have a (111) crystallographic orientation. In some embodiments, the etching process tuned to form the first facets of the second semiconductor and the second facets of the third semiconductor layer is a wet etch. The method further includes epitaxially growing a source/drain feature from the first facets of the second semiconductor layer and the second facets of the third semiconductor layer where the source/drain feature fills the source/drain recess and a void is disposed in the source/drain feature at a depth of the first semiconductor layer. In some embodiments, epitaxially growing the source/drain feature comprises epitaxially growing a first epitaxial layer in the source/drain recess and epitaxially growing a second epitaxial layer on the first epitaxial layer. In some embodiments, epitaxially growing the first epitaxial layer is controlled to define a first portion of the source/drain recess between third facets of the first epitaxial layer and a second portion of the source/drain recess between fourth facets of the first epitaxial layer where the third facets have the (111) crystallographic orientation and the fourth facets have the (110) crystallographic orientation. In some embodiments, the epitaxially growing the second epitaxial layer is controlled to achieve filling of the second portion of the source/ drain recess without filling the first portion of the source/drain recess, thereby forming the void in the source/drain feature. The method further includes forming a source/drain contact opening that exposes the void in the source/drain feature after replacing the first semiconductor layer with a gate stack. The method further includes forming a source/drain contact in the source/drain contact opening where the source/drain contact includes a silicide feature that fills the void.

In some embodiments, the semiconductor layer stack further includes a fourth semiconductor layer disposed between the third semiconductor layer and a fifth semiconductor layer. In some embodiments, the etching process further forms third facets of the fifth semiconductor layer where the third facets have the (111) crystallographic orientation. In some embodiments, the void is a first void, the source/drain feature further includes a second void and the fourth semiconductor layer is replaced with the gate stack. In some embodiments, the forming the source/drain contact opening does not expose the second void.

In some embodiments, the semiconductor layer stack further includes a fourth semiconductor layer disposed between the third semiconductor layer and a fifth semiconductor layer. In some embodiments, the etching process further forms third facets of the fifth semiconductor layer where the third facets have the (111) crystallographic orientation. In some embodiments, the void is a first void, the source/drain feature further includes a second void, and the fourth semiconductor layer is replaced with the gate stack. In some embodiments, the forming the source/drain contact opening exposes the second void and the silicide feature fills the second void.

Another exemplary device includes a first channel layer disposed over a substrate, a second channel layer disposed over the first channel layer, and a third channel layer disposed over the second channel layer. A gate stack surrounds the first channel layer, the second channel layer, and the third channel layer. The device further includes a source/drain feature disposed adjacent to the first channel layer, the second channel layer, the third channel layer, and the gate stack. The source/drain feature is disposed over first facets of the first channel layer, second facets of the second channel layer, and third facets of the third channel layer where the first facets, the second facets, and the third facets have a (111) crystallographic orientation. The device further includes, a first inner spacer and a second inner spacer disposed between the gate stack and the source/drain feature where the first inner spacer is further disposed between the first channel layer and the second channel layer and the second inner spacer is further disposed between the second channel layer and the third channel layer. A silicide feature is disposed over the source/drain feature where the silicide feature extends into the source/drain feature towards the substrate to a depth below the first channel layer. In some embodiments, the silicide feature comprises an upper portion and a lower portion where a width of the upper portion is greater than a width of the lower portion. In some embodiments, the upper portion of the silicide feature is disposed adjacent the third channel layer. In some embodiments, the lower portion of the silicide feature is disposed adjacent the first channel layer and the second channel layer. The device further includes, a source/drain contact is disposed over the silicide feature.

In some embodiments, the source/drain feature includes a first semiconductor layer and a second semiconductor layer where the first semiconductor layer is disposed over the first facets of the first channel layer, the second facets of the second channel layer, the first inner spacer, and the second inner spacer, and where the second semiconductor layer is disposed over the first semiconductor layer. In some embodiments, the first semiconductor layer has third facets and fourth facets, wherein the third facets have a (111) crystallographic orientation and the fourth facets have a (110) crystallographic orientation.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   forming a stack of semiconductor layers on a substrate, the stack of semiconductor layers including a first semiconductor layer, a second semiconductor layer disposed over the first semiconductor layer and a third semiconductor layer disposed over the second semiconductor layer;
   forming a first trench through the stack of semiconductor layers such that a portion of each of the first, second and third semiconductor layers is exposed by the first trench;
   forming a first epitaxial layer in the first trench;
   forming a second epitaxial layer on the first epitaxial layer in the first trench, wherein the second epitaxial layer defines a first void, a second void and a third void in the second epitaxial layer such that a bottom surface of the third void is disposed over a portion of the first epitaxial layer;
   forming a second trench through the first and second epitaxial layers to the expose the first void;
   forming a silicide layer in the second trench; and
   forming a contact feature directly on the silicide layer,
   wherein, along a direction perpendicular to a top surface of the substrate, the first void is disposed over the second void and the second void is disposed over the third void.

2. The method of claim 1, further comprising modifying the portions of the first and third semiconductor layers to include facets having a (111) crystallographic orientation prior to forming the first epitaxial layer in the first trench, and
   wherein the forming of the first epitaxial layer in the first trench includes forming the first epitaxial layer directly on the facets of the first and third semiconductor layers.

3. The method claim 1, wherein the first semiconductor layer is disposed at a first height above the substrate and a portion of the first void is positioned at the first height above the substrate.

4. The method of claim 3, wherein the silicide layer extends within the second trench towards the substrate such that a portion of the silicide layer is positioned at the first height above the substrate.

5. The method of claim 1,
   wherein the first void, second void and third void are separated from each other by portions of the second epitaxial layer along the direction such that the first, second and third voids are not in communication with each other.

6. The method of claim 5, wherein the second void and third void are still separated from each other by portions of the second epitaxial layer such that the second and third voids are not in communication with each other after the forming of the second trench through the first and second epitaxial layer to the expose the first void.

7. The method of claim 1, further comprising:
removing a first portion of the second semiconductor layer prior to forming the first epitaxial layer in the first trench; and
forming a inner spacer feature directly on a second portion of the second semiconductor layer, the inner spacer feature extending from the first semiconductor layer to the third semiconductor layer.

8. The method of claim 7, further comprising:
removing the second portion of the second semiconductor layer to form a space between the first and third semiconductor layers prior to the forming of the second trench through the first and second epitaxial layer to expose the first void; and
forming a gate structure in the space between the first and third semiconductor layers.

9. A method comprising:
forming a source/drain recess adjacent to a semiconductor layer stack disposed over a substrate, wherein the semiconductor layer stack includes a first semiconductor layer disposed between a second semiconductor layer and a third semiconductor layer;
performing a first etching process tuned to form first facets of the second semiconductor layer and second facets of the third semiconductor layer, wherein the first facets and the second facets have a (111) crystallographic orientation;
after forming the first facets and the second facets, performing a deposition process and a second etching process to form inner spacers adjacent to the first semiconductor layer;
epitaxially growing a source/drain feature from the first facets of the second semiconductor layer and the second facets of the third semiconductor layer, wherein the source/drain feature fills the source/drain recess and a void is disposed in the source/drain feature at a depth of the first semiconductor layer;
after replacing the first semiconductor layer with a gate stack, forming a source/drain contact opening that exposes the void in the source/drain feature; and
forming a source/drain contact in the source/drain contact opening, wherein the source/drain contact includes a silicide feature that fills the void.

10. The method of claim 9, wherein epitaxially growing the source/drain feature comprises:
epitaxially growing a first epitaxial layer in the source/drain recess; and
epitaxially growing a second epitaxial layer on the first epitaxial layer.

11. The method of claim 10, wherein the epitaxially growing the first epitaxial layer is controlled to define a first portion of the source/drain recess between third facets of the first epitaxial layer and a second portion of the source/drain recess between fourth facets of the first epitaxial layer, wherein the third facets have the (111) crystallographic orientation and the fourth facets have the (110) crystallographic orientation.

12. The method of claim 11, wherein the epitaxially growing the second epitaxial layer is controlled to achieve filling of the second portion of the source/drain recess without filling the first portion of the source/drain recess, thereby forming the void in the source/drain feature.

13. The method of claim 9, wherein the first etching process is a wet etch.

14. The method of claim 9, wherein the semiconductor layer stack further includes a fourth semiconductor layer disposed between the third semiconductor layer and a fifth semiconductor layer,
wherein the first etching process further forms third facets of the fifth semiconductor layer, wherein the third facets have the (111) crystallographic orientation,
wherein the void is a first void, the source/drain feature further includes a second void, and the fourth semiconductor layer is replaced with the gate stack, and
wherein the forming the source/drain contact opening does not expose the second void.

15. The method of claim 9, wherein the semiconductor layer stack further includes a fourth semiconductor layer disposed between the third semiconductor layer and a fifth semiconductor layer,
wherein the first etching process further forms third facets of the fifth semiconductor layer, wherein the third facets have the (111) crystallographic orientation,
wherein the void is a first void, the source/drain feature further includes a second void, and the fourth semiconductor layer is replaced with the gate stack,
wherein the forming the source/drain contact opening exposes the second void, and
wherein the silicide feature fills the second void.

16. A method comprising:
forming a stack of semiconductor layer on a substrate, the stack of semiconductor layers including a first semiconductor layer, a second semiconductor layer disposed over the first semiconductor layer and a third semiconductor layer disposed over the second semiconductor layer, the first semiconductor layer extending to a first height above the substrate, the second semiconductor layer extending to a second height above the substrate and the third semiconductor layer extending to a third height above the substrate, the first, second and third heights being different from each other;
forming a first trench through the stack of semiconductor layer such that a portion of each of the first, second and third semiconductor layers is exposed by the first trench;
forming a first epitaxial layer in the first trench;
forming a second epitaxial layer on the first epitaxial layer in the first trench, wherein the second epitaxial layer defines a first void, a second void and a third void in the second epitaxial layer after the forming of the second epitaxial layer, the first void positioned at least at the first height, the second void positioned at least at the second height and the third void positioned at least at the third height, wherein the first void, second void and third void are separated from each other by portions of the second epitaxial layer such that the first, second and third voids are not in communication with each other after the forming of the second epitaxial layer on the first epitaxial layer in the first trench;
forming a second trench through the first and second epitaxial layers to the expose the third void and the second void;

forming a silicide layer in the second trench such that a first portion of the silicide layer is positioned at the second height above the substrate; and forming a contact feature on the silicide layer.

17. The method of claim 16, wherein the forming of the second trench through the first and second epitaxial layers to the expose the third void and the second void further includes the second trench exposing the first void.

18. The method of claim 17, wherein a second portion of the silicide layer is positioned at the first height above the substrate after the forming of the silicide layer in the second trench, and wherein the second portion of the silicide layer is continuous with the first portion of the silicide layer.

19. The method of claim 16, wherein the contact feature interfaces with the silicide layer and the first epitaxial layer after the forming of the contact feature on the silicide layer.

20. The method of claim 16, wherein the second epitaxial layer has a different material composition than the first epitaxial layer.

* * * * *